(12) United States Patent
Kavala et al.

(10) Patent No.: US 12,047,082 B2
(45) Date of Patent: Jul. 23, 2024

(54) SEMICONDUCTOR DEVICE INCLUDING DELAY COMPENSATION CIRCUIT

(71) Applicant: Samsung Electronics Co., Ltd., Suwon-si (KR)

(72) Inventors: Anil Kavala, Yongin-si (KR); Seonkyoo Lee, Hwaseong-si (KR); Taesung Lee, Hwaseong-si (KR); Jeongdon Ihm, Seongnam-si (KR); Byunghoon Jeong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/994,296

(22) Filed: Nov. 26, 2022

(65) Prior Publication Data

US 2023/0091026 A1 Mar. 23, 2023

Related U.S. Application Data

(63) Continuation of application No. 17/077,891, filed on Oct. 22, 2020, now Pat. No. 11,522,550.

(30) Foreign Application Priority Data

Apr. 10, 2020 (KR) .................. 10-2020-0044008

(51) Int. Cl.
*G11C 7/22* (2006.01)
*H03K 5/133* (2014.01)
(Continued)

(52) U.S. Cl.
CPC ............ *H03L 7/0816* (2013.01); *G11C 7/222* (2013.01); *H03K 5/133* (2013.01); *H03L 7/085* (2013.01);
(Continued)

(58) Field of Classification Search
CPC ..... G11C 7/222; G11C 29/023; G11C 29/028; H03L 7/0816; H03L 7/085; H03K 5/133
(Continued)

(56) References Cited

U.S. PATENT DOCUMENTS 6,242,954 B1   6/2001   Taniguchi et al.
6,812,753 B2   11/2004  Lin
(Continued)

FOREIGN PATENT DOCUMENTS

CN   101136739 A   *   3/2008   ........... H03L 7/0814
JP   3564392 B2    *   9/2004   ............... H03L 7/07
(Continued)

*Primary Examiner* — Ly D Pham
(74) *Attorney, Agent, or Firm* — Muir Patent Law, PLLC

(57) ABSTRACT

A semiconductor device includes an internal clock generation circuit configured to generate an internal clock; a plurality of unit circuits configured to have a first unit circuit and a second unit circuit operating while being synchronized with an internal clock; a plurality of transfer circuits including a first transfer circuit configured to provide a first transfer path having a first delay time, and a second transfer circuit configured to provide a second transfer path having a second delay time different from the first delay time; and a delay compensation circuit configured to compare a first clock input to the first unit circuit through the first transfer path with a second clock input to the second unit circuit through the second transfer path, and to adjust the second delay time so that the adjusted second delay time matches the first delay time.

20 Claims, 23 Drawing Sheets

(51) Int. Cl.
*H03L 7/081* (2006.01)
*H03L 7/085* (2006.01)
*G11C 29/02* (2006.01)

(52) U.S. Cl.
CPC .......... *G11C 29/023* (2013.01); *G11C 29/028* (2013.01)

(58) Field of Classification Search
USPC ........................................................ 365/193
See application file for complete search history.

(56) References Cited

U.S. PATENT DOCUMENTS

| | | | |
|---|---|---|---|
| 6,993,109 B2 * | 1/2006 | Lee | ................. H03L 7/0805 327/158 |
| 7,629,827 B2 | 12/2009 | Fukuoka et al. | |
| 7,706,996 B2 | 4/2010 | Chong et al. | |
| 8,122,275 B2 | 2/2012 | Chong et al. | |
| 8,324,946 B2 | 12/2012 | Becker et al. | |
| 9,330,749 B1 | 5/2016 | Choksey et al. | |
| 9,490,030 B2 | 11/2016 | Kang et al. | |
| 10,355,698 B2 | 7/2019 | Gomm et al. | |
| 10,367,493 B1 * | 7/2019 | Addepalli | ............. H03L 7/0891 |
| 10,418,089 B2 | 9/2019 | Zerbe et al. | |
| 10,784,871 B1 | 9/2020 | Xanthopoulos et al. | |
| 2001/0052808 A1 | 12/2001 | Hamamoto et al. | |
| 2002/0031193 A1 * | 3/2002 | Harrison | ................. H03L 7/085 375/340 |
| 2002/0043996 A1 | 4/2002 | Iwamoto | |
| 2003/0185088 A1 | 10/2003 | Kono | |
| 2004/0223571 A1 * | 11/2004 | Donnelly | ............. H03L 7/0814 375/371 |
| 2007/0069781 A1 | 3/2007 | Kim et al. | |
| 2007/0146028 A1 | 6/2007 | Lee | |
| 2007/0171760 A1 | 7/2007 | Gomm et al. | |
| 2008/0079470 A1 | 4/2008 | Yun et al. | |
| 2009/0019407 A1 | 1/2009 | Matsui | |
| 2009/0072877 A1 | 3/2009 | Fukuoka et al. | |
| 2009/0179675 A1 | 7/2009 | Lee et al. | |
| 2019/0214062 A1 | 7/2019 | Chae et al. | |

FOREIGN PATENT DOCUMENTS

| | | | |
|---|---|---|---|
| JP | 2008010607 A | | 1/2008 |
| KR | 20190068033 A | * | 6/2019 ............. G11C 7/222 |

* cited by examiner

SEMICONDUCTOR DEVICE INCLUDING DELAY COMPENSATION CIRCUIT

CROSS-REFERENCE TO RELATED APPLICATION(S)

This application is a Continuation of U.S. patent application Ser. No. 17/077,891 filed on Oct. 22, 2020, now U.S. Pat. No. 11,522,550, which claims benefit of priority to Korean Patent Application No. 10-2020-0044008 filed on Apr. 10, 2020 in the Korean Intellectual Property Office, the disclosure of which is incorporated herein by reference in its entirety.

BACKGROUND

Example embodiments of the present disclosure relate to a semiconductor device.

A semiconductor device may include circuits operating according to a clock signal, and two or more circuits may operate by receiving the same clock signal. To input the same clock signal to two or more circuits, a clock tree providing a transfer path of a clock signal may be included in a semiconductor device. Clock trees may be disposed symmetrically to reduce a clock skew between clock signals input to the circuits, but when such clock trees are disposed in a symmetrical structure, the number of devices included in a clock tree may increase, such that integration density of a semiconductor device may be degraded.

SUMMARY

An example embodiment of the present disclosure is to provide a semiconductor device which may effectively compensate a skew between clock signal, may reduce the number of devices included in a clock tree, and may reduce fluctuations in a clock signal.

According to an example embodiment of the present disclosure, a semiconductor device includes an internal clock generation circuit configured to receive an external clock and to generate an internal clock; a plurality of unit circuits configured to have a first unit circuit and a second unit circuit operating while being synchronized with the internal clock; a plurality of transfer circuits including a first transfer circuit configured to provide a first transfer path having a first delay time and connected between the first unit circuit and the internal clock generation circuit, and a second transfer circuit configured to provide a second transfer path having a second delay time different from the first delay time and connected between the second unit circuit and the internal clock generation circuit; and a delay compensation circuit configured to compare a first operation clock input to the first unit circuit through the first transfer path with a second operation clock input to the second unit circuit through the second transfer path, and to adjust the second delay time so that the adjusted second delay time matches the first delay time. The first delay time may be a longest delay time from among delay times between the internal clock generation circuit and different ones of the unit circuits.

According to an example embodiment of the present disclosure, a semiconductor device includes input/output circuits configured to input and output data signals according to a clock signal; a delay locked loop circuit configured to generate the clock signal; a plurality of repeaters connected between the delay locked loop circuit and the input/output circuits and configured to transmit the clock signal to the input/output circuit; a comparator connected between a first input/output circuit and a second input/output circuit among the input/output circuits, and configured to compare a first clock signal input to the first input/output circuit with a second clock signal input to the second input/output circuit; and a delay chain configured to adjust a phase of the second clock signal based on an output of the comparator, to allow the first clock signal and the second clock signal to have the same phase.

According to an example embodiment of the present disclosure, a semiconductor device includes a clock generation circuit configured to generate a clock signal; a first delay circuit configured to delay the clock signal by a first delay time and to input the clock signal delayed by the first delay time to a first unit circuit; a second delay circuit configured to delay the clock signal by a second delay time shorter than the first delay time and to input the clock signal delayed by the second delay time to a second unit circuit different from the first unit circuit; and a delay compensation circuit configured to compare the first delay time with the second delay time, and to increase the second delay time to result in an increased second delay time that matches the first delay time.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the accompanying drawings.

Figure 1:
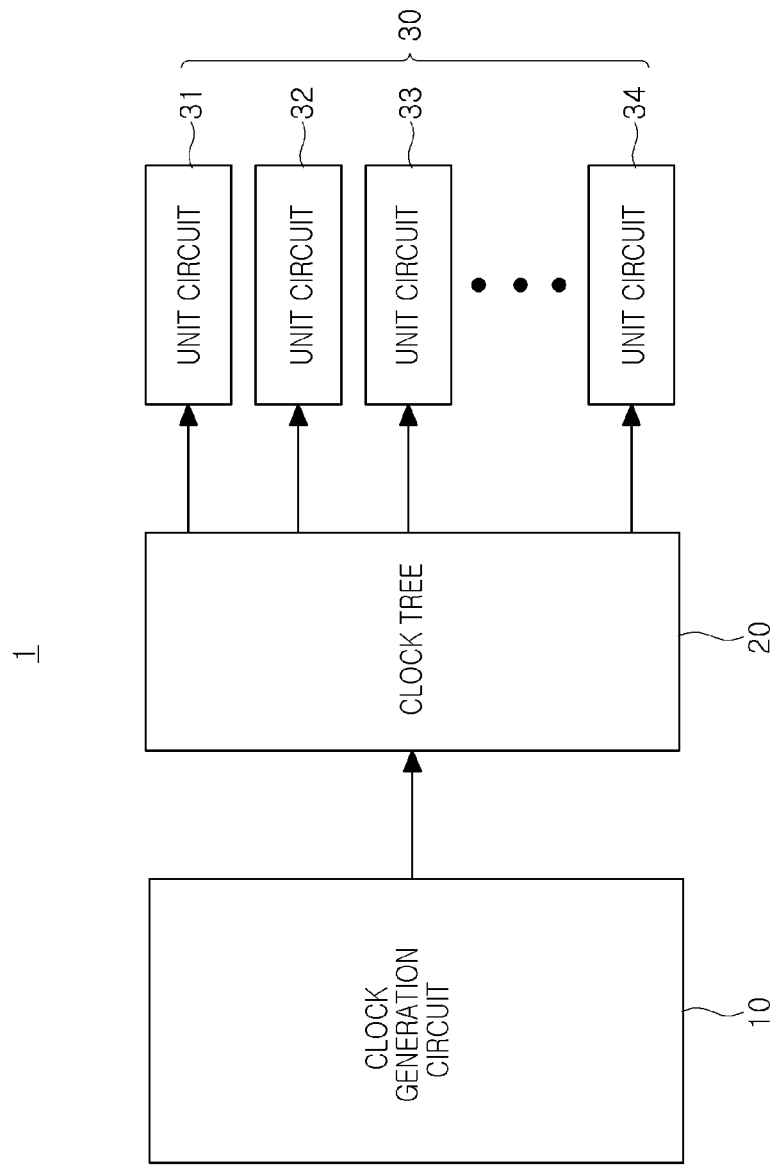
FIG. 1 is a block diagram illustrating a semiconductor device according to an example embodiment of the present disclosure.

FIG. 1 is a block diagram illustrating a semiconductor device according to an example embodiment.

Referring to FIG. 1, a semiconductor device 1 in an example embodiment may include a clock generation circuit 10, a clock tree 20, and a plurality of unit circuits 31 to 34 (30). The clock generation circuit 10 may generate an internal clock for operations of the semiconductor device 1 using an external clock received by the semiconductor device 1 from an external device (e.g., a memory controller). In an example embodiment, the clock generation circuit 10 may include a delay locked loop (DLL) circuit.

The clock tree 20 may be a circuit providing transfer paths for transferring an internal clock generated by the clock generation circuit 10 to the unit circuits 30. The clock tree 20 may include a plurality of repeaters for transferring an internal clock. As an example, each of the repeaters may include at least one buffer. Accordingly, a signal delay may occur while the internal clock is transferred to the unit circuits 30 through the repeaters. To synchronize the internal clock transferred to each of the unit circuits 30, various methods for compensating for a difference in delay times of the transfer paths connected to the unit circuits 30 may be applied to the clock tree 20.

The unit circuits 30 may be circuits operating using an internal clock. As an example, the unit circuits 30 may be input and output circuits for transmitting a signal to and receiving a signal from an external device (e.g., a memory controller). The input and output circuits may be synchronized with an internal clock and to transmit a signal or to receive a signal. The input and output circuits described herein are also described as input/output circuits, each configured to input and output data signals or data strobe signals. In example embodiments, the unit circuits 31 to 34 may have the same operation and structure. For example, the unit circuits 31 to 34 may be input/output circuits (e.g., identical input/output circuits). In example embodiments, at least a portion of the unit circuits 31 to 34 may have a different operation and structure. For example, the unit circuits 31 and 32 may be input/output circuits, the unit circuit 33 may be a data strobe buffer configured to output data strobe signal DQS or DQSB, and the unit circuit 34 may be a data inversion buffer configured to output data mask signal (DM or DMI) for providing a data bus inversion DBI function.

When there is a difference in delay times between the transfer paths of the clock tree 20 transferring the internal clock, operation timings of the unit circuits 30 may be different, and reliability of the semiconductor device 1 may be degraded. To handle such an issue, the clock tree 20 may be designed to allow the transfer paths of the clock tree 20 to have the same delay time. However, when the clock tree 20 is designed to allow the transfer paths to have the same delay time, a number of devices for implementing the transfer paths may be increased such that integration density of the semiconductor device 1 may be degraded. Also, a shielding space disposed between the transfer paths to reduce parasitic capacitance, or the like, may not be sufficiently disposed, and accordingly, when a frequency of an internal clock is high, jitter may occur such that an eye margin may be reduced, or other issues may occur.

In an example embodiment, an internal clock transferred through a transfer path having the longest delay time in the clock tree 20 may be selected as a reference clock, and delay times of the other transfer paths may be adjusted with reference to a delay time of the reference clock. Accordingly, the number of devices included in the clock tree 20 may be reduced such that integration density of the semiconductor device 1 may be improved, and a sufficient shielding space may be disposed between the transfer paths such that a stable high-speed operation may be provided.

Figure 2:
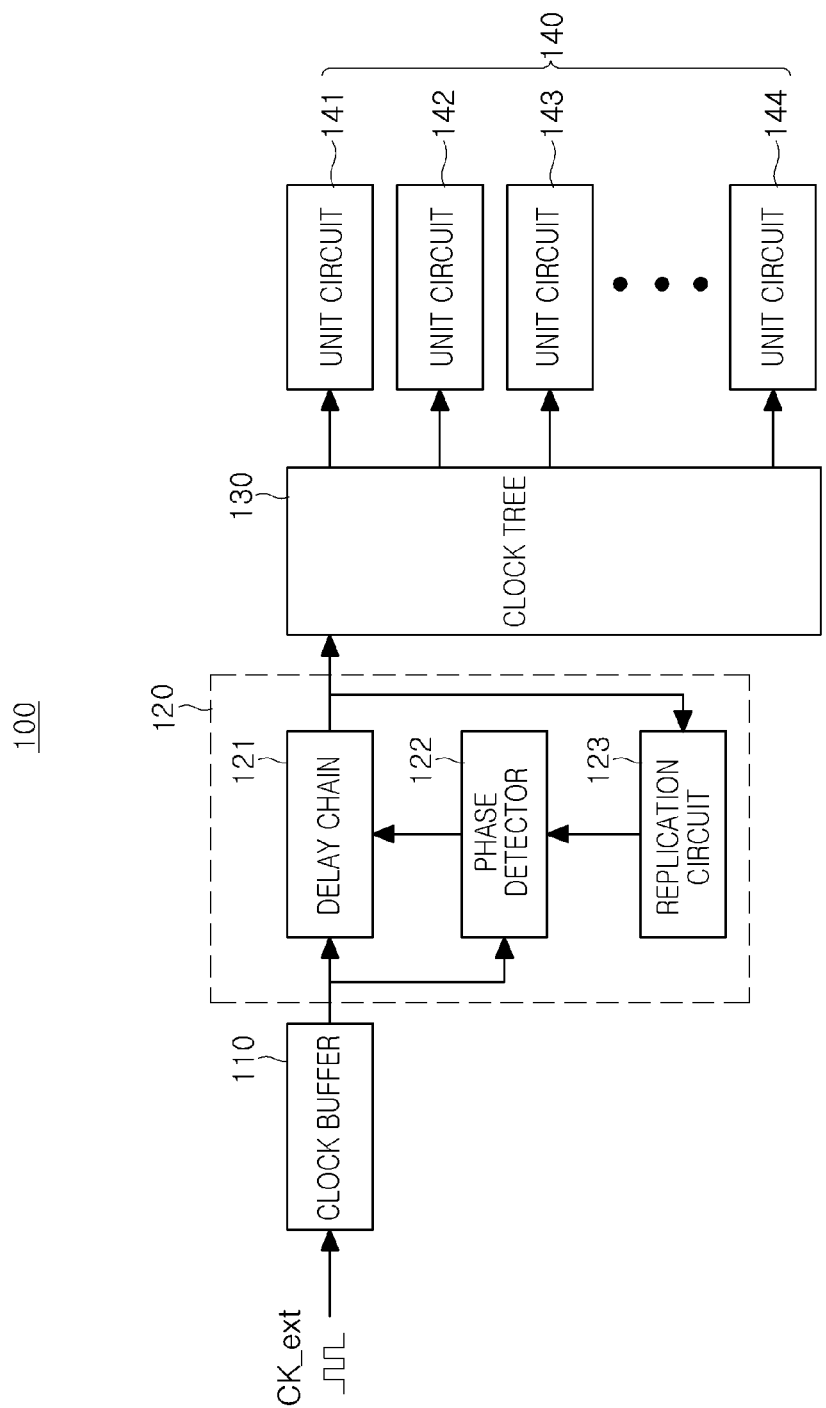
FIG. 2 is a block diagram illustrating a semiconductor device according to an example embodiment of the present disclosure.

FIG. 2 is a block diagram illustrating a semiconductor device according to an example embodiment.

Referring to FIG. 2, a semiconductor device 100 in an example embodiment may include a clock buffer 110, a clock generation circuit 120, a clock tree 130, and a plurality of unit circuits 141 to 144 (140). The clock buffer 110 may buffer an external clock CK_ext which the semiconductor device 100 has received from an external entity (e.g., a memory controller) and may output the external clock.

The clock generation circuit 120 may generate an internal clock CK_int using the external clock CK_ext buffered by the clock buffer 110, and may include a DLL circuit, a phase locked loop (PLL) circuit, and the like, for example. In an example embodiment illustrated in FIG. 2, the generation circuit 120 may include a delay chain 121, a phase detector 122, a replication circuit 123, or the like. The delay chain 121 may operate according to a certain control signal, and may delay the external clock CK_ext and may output the internal clock CK_int. The internal clock CK_int may be synchronized with the external clock CK_ext by the DLL circuit or the PLL circuit.

The replication circuit 123 may replicate delay properties of the clock tree 130 and may provide the replicated delay properties. As an example, the amount of delay occurring while a signal passes through the clock tree 130 may be substantially the same as the mount of delay occurring while the signal passes through the replication circuit 123. The replication circuit 123 may delay the internal clock CK_int output by the delay chain 121 according to the amount of delay to which the delay properties of the clock tree 130 is reflected, and may output the internal clock CK_int to the phase detector 122.

The phase detector 122 may compare an output of the replication circuit 123 with an output of the clock buffer 110 and may generate a phase comparison signal. In an example embodiment, when an output of the replication circuit 123 has a phase faster than a phase of an output of the clock buffer 110, the phase detector 122 may enable a phase comparison signal, and when an output of the replication circuit 123 has a phase slower than a phase of an output of the clock buffer 110, the phase detector 122 may disable the phase comparison signal. A phase comparison signal output by the phase detector 122 may be input to the delay chain 121 as a control signal.

The delay chain 121 may generate the internal clock CK_int by increasing or decreasing the amount of delay of the external clock CK_ext according to the phase comparison signal. As an example, the delay chain 121 may increase the amount of delay of the external clock CK_ext when a phase comparison signal is enabled, and when a phase comparison signal is disabled, the delay chain 121 may decrease the amount of delay of the external clock CK_ext.

The clock tree 130 may include a plurality of transfer circuits for transferring the internal clock CK_int to the unit circuits 140. As an example, each of the transfer circuits may provide one or more transfer paths, and each of the transfer paths may be implemented as a plurality of repeaters. When a skew of the internal clock CK_int is generated in each of the unit circuits 140, an operation timing of each of the unit circuits 140 may be different, and accordingly, an error may occur in operations of the semiconductor device 100. Accordingly, the clock tree 130 may be designed to allow the transfer paths transferring the internal clock CK_int to the unit circuits 140 to have the same delay time as each other.

Figure 3:
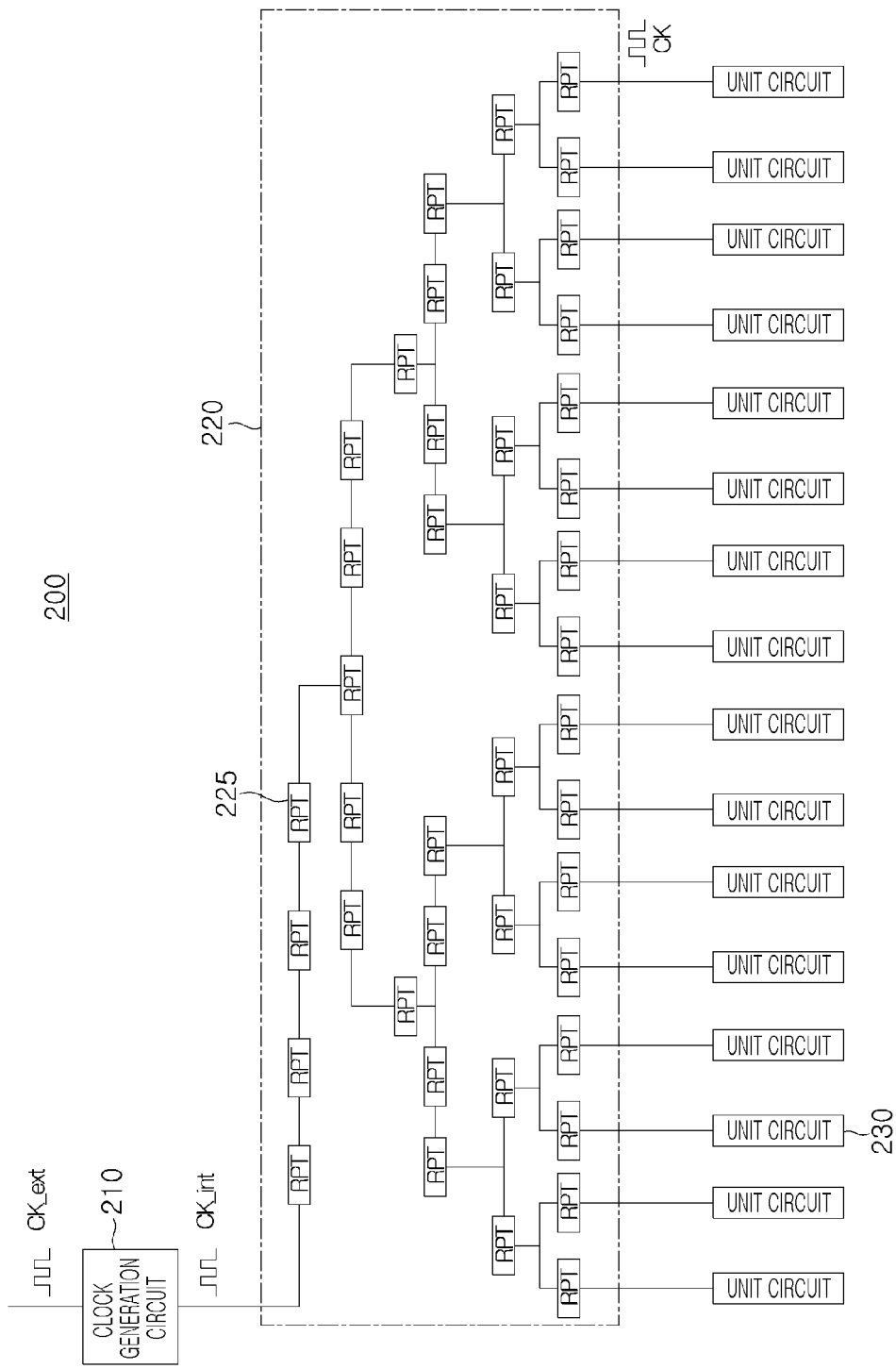
FIGS. 3 and 4 are diagrams illustrating operations of a semiconductor device according to an example embodiment of the present disclosure.
Figure 4:
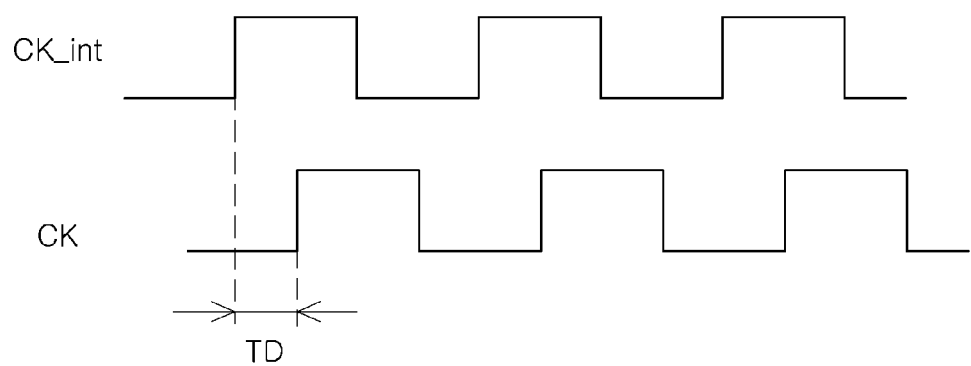

FIGS. 3 and 4 are diagrams illustrating operations of a semiconductor device according to an example embodiment.

Referring to FIG. 3, a semiconductor device 200 may include a clock generation circuit 210 for generating an internal clock CK_int using an external clock CK_ext, and a clock tree 220 for transferring the internal clock CK_int to a plurality of unit circuits 230. The clock tree 220 may include a plurality of repeaters RPT 225, and each of the plurality of repeaters 225 may include at least one buffer, for example. The unit circuits 230 may be circuits operating by being synchronized with an operation clock CK output by the clock tree 220. Hereinafter, the external clock CK_ext may be received from outside a semiconductor device or from a clock buffer included in the semiconductor device.

In an example embodiment illustrated in FIG. 3, the repeaters 225 included in the clock tree 220 may be connected to each other according to an H-tree structure. Transfer paths for connecting the clock generation circuit 210 to the unit circuits 230 may have the same delay time as each other. For example, each of the unit circuits 230 may receive the operation clock CK from the clock tree 220. Accordingly, the operation clocks CK input to the unit circuits 230 may have substantially the same phase.

FIG. 4 is a diagram illustrating an internal clock CK_int input to a clock tree 220 and an operation clock CK output from the clock tree 220. Referring to FIG. 4, a certain delay time TD may occur between the internal clock CK_int and the operation clock CK according to the amount of delay of each of repeaters 225 included in the clock tree 220. The delay time TD may vary depending on the number of the repeaters 225 included in the transfer path of the internal clock CK_int, an error occurring in a process of manufacturing the semiconductor device 200 including the clock tree 220, an operational environment of the semiconductor device 200, or the like.

When the clock tree 220 is configured as in FIGS. 3 and 4, the number of the repeaters 225 required to implement the transfer paths through which the operation clock CK is transferred to the unit circuits 230 may increase. Accordingly, integration density of the semiconductor device 200 may be degraded. Also, as the number of the repeaters 225 increases, it may be difficult to sufficiently secure a shielding space between the transfer paths, and accordingly, a jitter element of the operation clock CK may increase.

In an example embodiment, a clock tree may be implemented as a fly-by type clock tree. Accordingly, the number of repeaters required to implement the clock tree connected to the same number of unit circuits as FIG. 3 may be decreased, and a jitter element of each of the operation clocks CK may be decreased. Also, among the operation clocks CK input to the unit circuits, a delay time of each of the other operation clocks may be adjusted with reference to an operation clock having the longest delay time. Accordingly, a skew of each of the operation clocks which may occur due to changes in operational environment, an operating voltage, and the like, after the semiconductor device is manufactured and shipped, may be effectively compensated.

Figure 5:
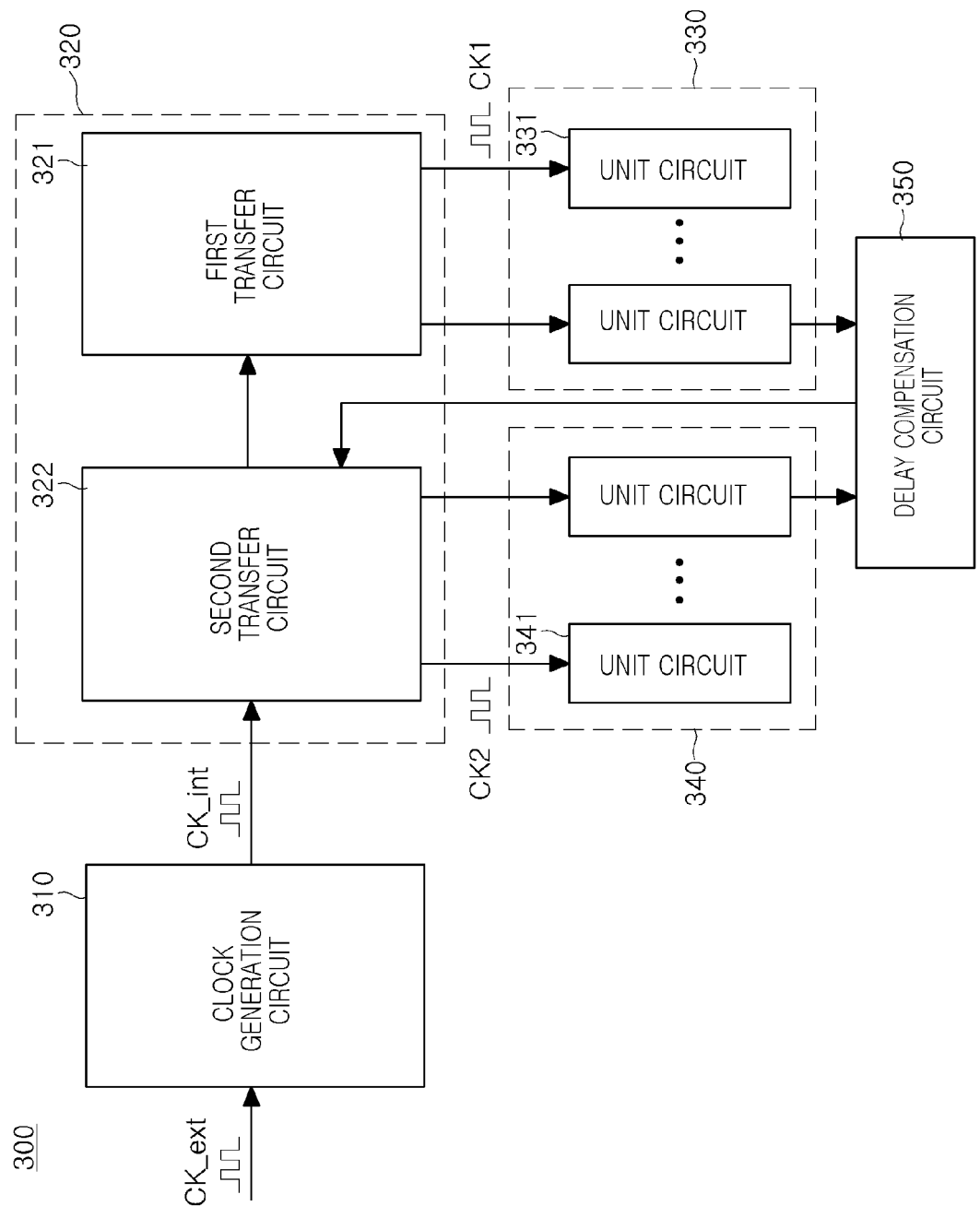
FIG. 5 is a block diagram illustrating a semiconductor device according to an example embodiment of the present disclosure.

FIG. 5 is a block diagram illustrating a semiconductor device according to an example embodiment.

Referring to FIG. 5, a semiconductor device 300 in an example embodiment may include a clock generation circuit 310, a clock tree 320, a plurality of unit circuits 330 and 340, and a delay compensation circuit 350. The clock generation circuit 310 may generate an internal clock CK_int using an external clock CK_ext. As an example, the clock generation circuit 310 may include a delay locked loop circuit or a phase locked loop circuit.

The clock tree 320 may include a first transfer circuit 321 and a second transfer circuit 322. The unit circuits 330 and 340 may include first unit circuits 330 connected to the first transfer circuit 321 and second unit circuits 340 connected to the second transfer circuit 322. The first transfer circuit 321 may output a first operation clock CK1, and the second transfer circuit 322 may output a second operation clock CK2. In an example embodiment, the first operation clock CK1 and the second operation clock CK2 may have the same frequency.

As illustrated in FIG. 5, the internal clock CK_int may be input from the clock generation circuit 310 to the first transfer circuit 321 through the second transfer circuit 322. Accordingly, first transfer paths through which the first transfer circuit 321 transfers the first operation clock CK1 to the first unit circuits 330 may have the amount of delay greater than that of second transfer paths through which the second transfer circuit 322 transfers the second operation clock CK2 to the second unit circuits 340. As an example, the delay time of the first operation clock CK1 may be longer than the delay time of the second operation clock CK2 with reference to the internal clock CK_int at an initial state of operations of the semiconductor device 300. Alternatively, it may be understood that the first operation clock CK1 may have a phase slower than a phase of the second operation clock CK2 at an initial state of operations of the semiconductor device 300.

In an example embodiment, the delay compensation circuit 350 may compare the first operation clock CK1 output from the first unit circuit 331 with the second operation clock CK2 output from the second unit circuit 341. In an example embodiment, the delay compensation circuit 350 may compare the first operation clock CK1 input to at least one of the first unit circuits 330 with the second operation clock CK2 input to at least one of the second unit circuits 340, and may adjust the amount of delay of the second transfer circuit 322 according to a result of the comparison. As an example, the second transfer circuit 322 may include a delay chain, or the like, which may adjust a delay time of the second operation clock CK2. A delay chain in the second transfer circuit 322 may be connected between repeaters directly connected to each other. The delay compensation circuit 350 may adjust the amount of delay of the delay chain included in the second transfer circuit 322 according to a result of the comparison between the first operation clock CK1 and the second operation clock CK2 such that the first operation clock CK1 and the second operation clock CK2 may have substantially the same phase.

In an example embodiment, the delay compensation circuit 350 may control the second operation clock CK2 to be synchronized with the first operation clock CK1 at a certain interval or in response to a request of a control logic, and the like, included in the semiconductor device 300. As an operational environment, and the like, of the semiconductor device 300 changes, the amount of delay of each of the first operation clock CK1 and the second operation clock CK2 may be changed, and accordingly, a difference may occur in phases between the first operation clock CK1 and the second operation clock CK2. Thus, the delay compensation circuit 350 may adjust a delay time of the second operation clock CK2 according to the first operation clock CK1 at a predetermined interval or based on a request of a control logic which has sensed changes in operational environment, and accordingly, performance of the semiconductor device 300 may be improved.

Figure 6:
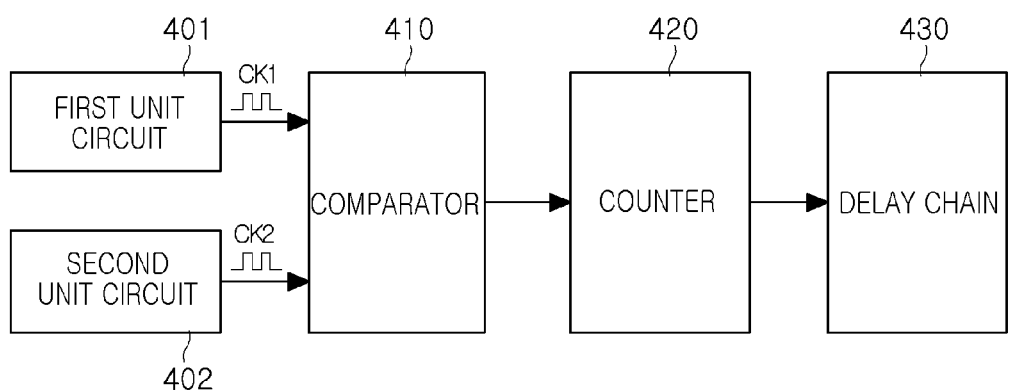
FIG. 6 is a block diagram illustrating a delay compensation circuit included in a semiconductor device according to an example embodiment of the present disclosure.

FIG. 6 is a block diagram illustrating a delay compensation circuit included in a semiconductor device according to an example embodiment.

Referring to FIG. 6, a delay compensation circuit 400 in an example embodiment may include a comparator 410, a counter 420, and a delay chain 430. The comparator 410 may compare a first operation clock CK1 input to a first unit circuit 401 with a second operation clock CK2 input to a second unit circuit 402.

The counter 420 may count an output of the comparator 410. As an example, the counter 420 may count a time for which the first operation clock CK1 is greater than the second operation clock CK2 or a time for which the second operation clock CK2 is greater than the first operation clock CK1. The delay chain 430 may synchronize, with reference to one of the first operation clock CK1 and the second operation clock CK2, the first operation clock CK1 and the second operation clock CK2 with each other by delaying the other.

In the description below, operations of the delay compensation circuit 400 will be described in greater detail with reference to FIGS. 7 and 8.

Figure 7:
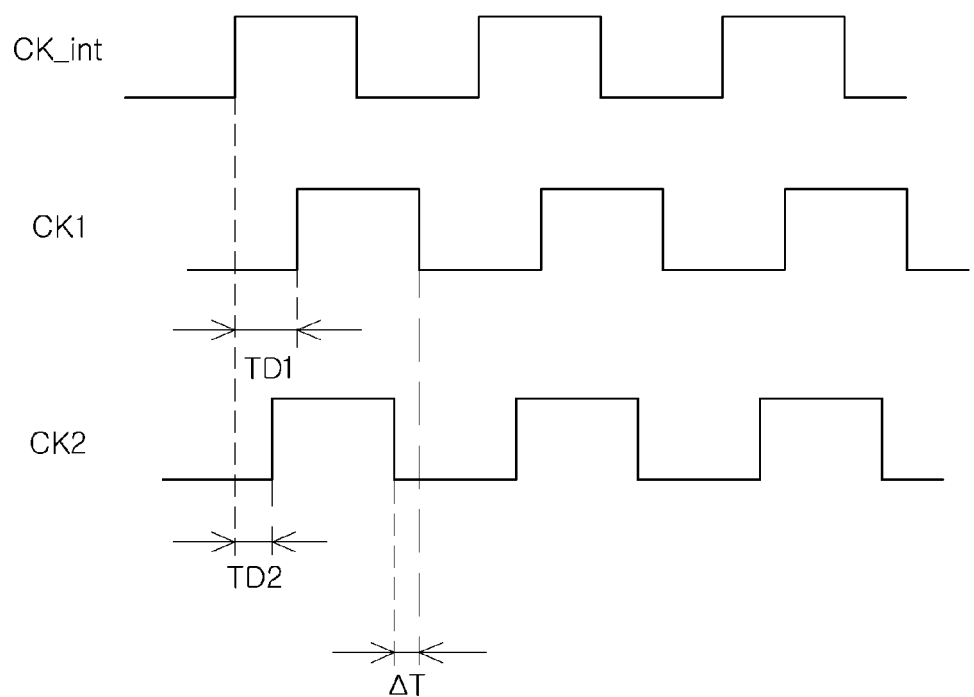
FIGS. 7 and 8 are diagrams illustrating operations of a delay compensation circuit according to an example embodiment of the present disclosure.
Figure 8:
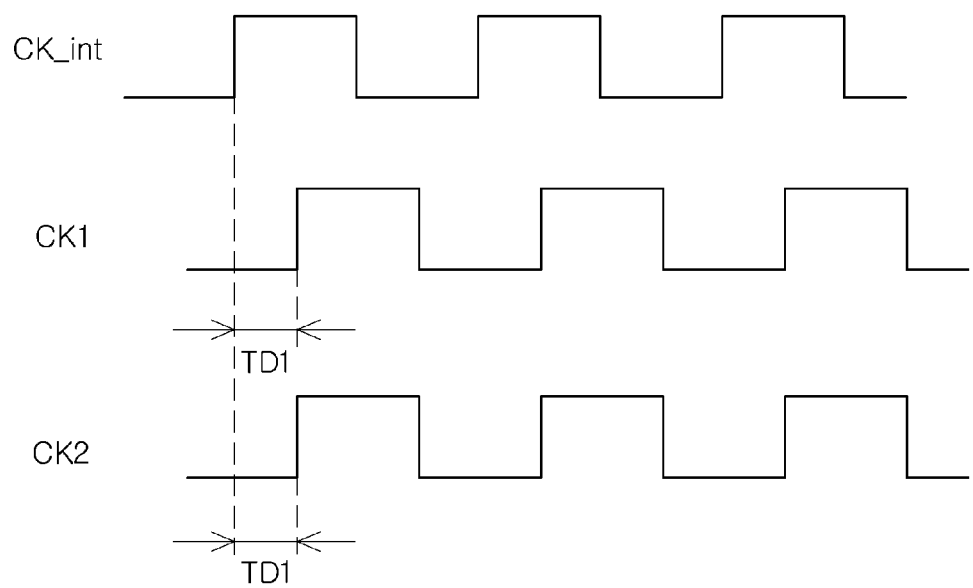

FIGS. 7 and 8 are diagrams illustrating a comparative example of a semiconductor device according to an example embodiment.

FIGS. 7 and 8 are diagrams illustrating a first operation clock CK1 input to a first unit circuit 401, a second operation clock CK2 input to a second unit circuit 402, and an internal clock CK_int. In an example embodiment illustrated in FIGS. 7 and 8, the internal clock CK_int may be a clock which a clock tree providing the first operation clock CK1 and the second operation clock CK2 to the first unit circuit 401 and the second unit circuit 402 receives. The internal clock CK_int may have a frequency and a duty ratio the same as those of the first operation clock CK1 and the second operation clock CK2.

FIG. 7 is a diagram illustrating a state before a delay compensation circuit 400 compensate for a difference in the amounts of delay between the first operation clock CK1 and the second operation clock CK2. Referring to FIG. 7, the first operation clock CK1 may be delayed by a first delay time TD1 and the second operation clock CK2 may be delayed by a second delay time TD2 with reference to the internal clock CK_int. The first delay time TD1 may be longer than the second delay time TD2.

As an example, when the first operation clock CK1 and the second operation clock CK2 are input to the comparator 410, the counter 420 may count a time for which the first operation clock CK1 and the second operation clock CK2 have different values. In an example embodiment illustrated in FIG. 7, the counter 420 may count a time difference ΔT between the first delay time TD1 and the second delay time TD2.

A result of the counting the time difference ΔT between the first delay time TD1 and the second delay time TD2 by the counter 420 may be transmitted to a delay chain 430. As an example, the chain 430 may receive the time difference ΔT counted by the counter 420 in a form of a digital code. The delay chain 430 may adjust at least one of the first operation clock CK1 and the second operation clock CK2 to allow a difference between the first delay time TD1 and the second delay time TD2 to be 0 with reference to the time difference ΔT.

As an example, the delay chain 430 may adjust a delay time of the second operation clock CK2 in accordance with the first operation clock CK1 having a longer delay time with reference to the internal clock CK_int. Referring to FIG. 8, the delay chain 430 may adjust a delay time of the second operation clock CK2 to be the first delay time TD1 based on the time difference ΔT received from the counter 420. Accordingly, a skew of the first operation clock CK1 and the second operation clock CK2 may be reduced.

Figure 9:
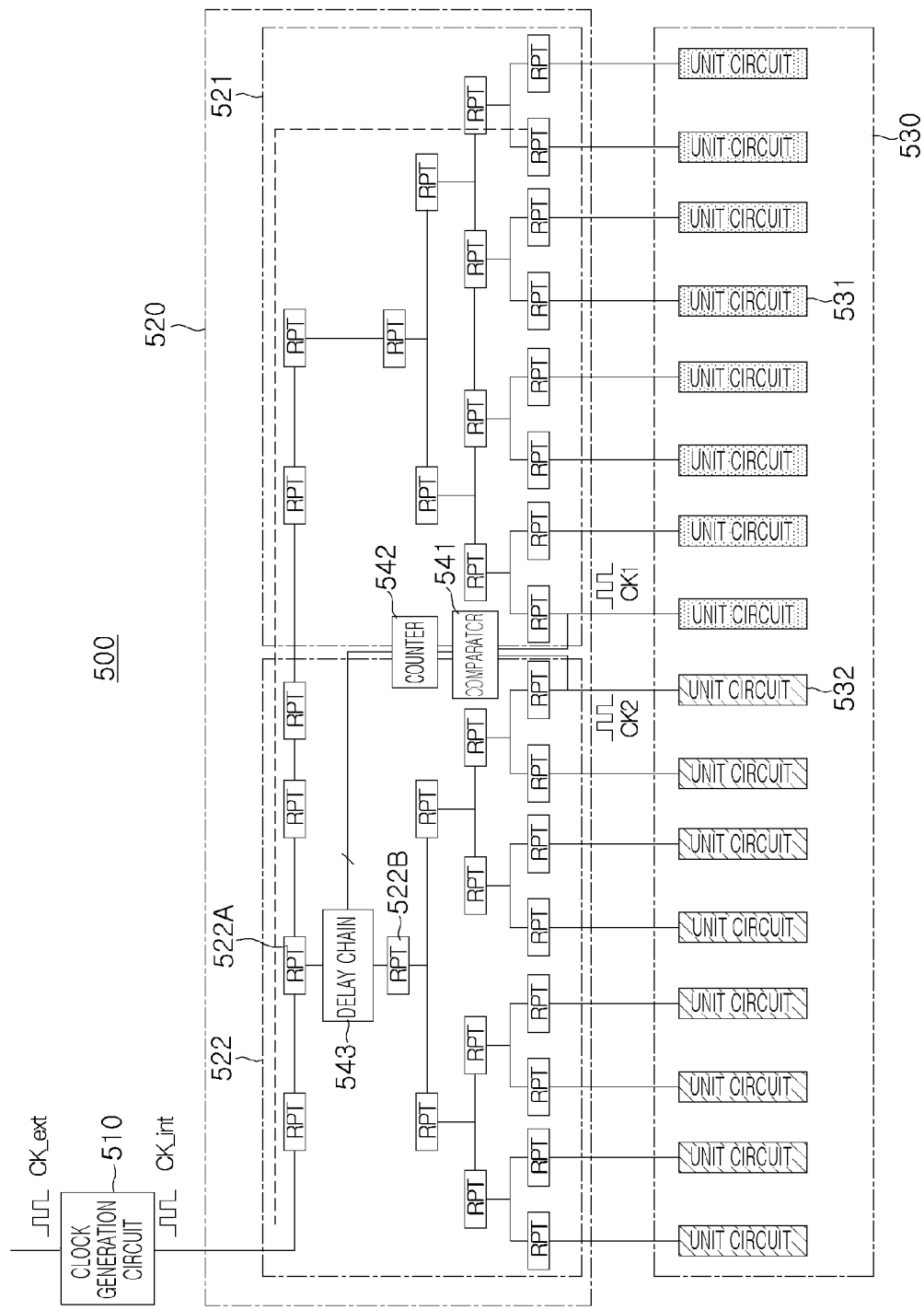
FIG. 9 is a diagram illustrating operations of a semiconductor device according to an example embodiment of the present disclosure.

FIG. 9 is a diagram illustrating an operations of a semiconductor device according to an example embodiment.

Referring to FIG. 9, a semiconductor device 500 in an example embodiment may include a clock generation circuit 510, a clock tree 520, and a plurality of unit circuits 530.

The internal clock CK_int may be input to a clock tree 520. The clock tree 520 may include a first transfer circuit 521 and a second transfer circuit 522 which transfer the internal clock CK_int to a plurality of unit circuits 530. Each of the first transfer circuit 521 and the second transfer circuit 522 may include a plurality of repeaters RPT. Each of the repeaters RPT may include at least one buffer, and the internal clock CK_int may be delayed in the repeaters RPT.

The unit circuits 530 may include first unit circuits 531 and second unit circuits 532. The first transfer circuit 521 may be defined as a first delay circuit which may delay the internal clock CK_int by a first delay time and may input the internal clock CK_int to the first unit circuits 531, and the second transfer circuit 522 may be defined as a second delay circuit which may delay the internal clock CK_int by a second delay time and may input the internal clock CK_int to the second unit circuits 532.

The second delay time may be shorter than the first delay time. Referring to FIG. 9, the first transfer circuit 521 may receive the internal clock CK_int from a clock generation circuit 510 through the second transfer circuit 522. As the internal clock CK_int which has passed through at least a portion of the repeaters included in the second transfer circuit 522 may be input to the first transfer circuit 521, the first delay time may be longer than the second delay time.

In an example embodiment illustrated in FIG. 9, a first transfer circuit 521 may receive an internal clock CK_int which has passed through four repeaters RPT included in the second transfer circuit 522, and accordingly, a difference may occur between a first delay time and a second delay time by a delay time of the four repeaters RPT. The difference between the first delay time and the second delay time may lead to a difference between a first operation clock CK1 input to the first unit circuit 531 and a second operation clock CK2 input to the second unit circuit 532. As an example, due to the difference between the first delay time and the second delay time, a phase difference may occur between the first operation clock CK1 and the second operation clock CK2.

When a phase difference occurs between the first operation clock CK1 and the second operation clock CK2, operation timings of the first unit circuit 531 and the second unit circuit 532 may not match, and an error may occur in operations of the semiconductor device 500. In an example embodiment, a delay compensation circuit which may compare the first operation clock CK1 detected from an input terminal of the first unit circuit 531 with the second operation clock CK2 detected from an input terminal of the second unit circuit 532, and may adjust the second delay time according to a result of the comparison. Accordingly, a phase difference between the first operation clock CK1 and the second operation clock CK2 may be reduced.

As an example, the delay compensation circuit may include a comparator 541, a counter 542, and a delay chain 543. The comparator 541 may receive the first operation clock CK1 and the second operation clock CK2 and may compare the first operation clock CK1 with the second operation clock CK2. Referring to FIG. 9, the comparator 541 may receive the first operation clock CK1 and the second operation clock CK2 from input terminals of the first unit circuit 531 and the second unit circuit 532. In example embodiments, the input terminals of the comparator 541 may also be connected to nodes included in the first unit circuit 531 and the second unit circuit 532 or output terminals of the first unit circuit 531 and the second unit circuit 532.

The counter 542 may count a section in which the first operation clock CK1 and the second operation clock CK2 have different values, and may output a result of the counting to the delay chain 543. The delay chain 543 may adjust a second delay time of the second transfer circuit 522 based on the information received from the counter 542. As an example, the delay chain 543 may increase the second delay time to match the first delay time.

The delay chain 543 may be connected between a first repeater 522A and a second repeater 522B in the second transfer circuit 522. The delay chain 543 may further delay the internal clock CK_int which has passed through the first repeater 522A by the difference between the first delay time and the second delay time and may input the internal clock CK_int to the second repeater 522B. As an example, the second repeater 522B may be connected to all the second unit circuits 532 through a plurality of repeaters RPT. Accordingly, the difference between the first delay time and the second delay time further delayed by the delay chain 543 may be reflected in all the second operation clocks CK2 input to the second unit circuits 532.

In an example embodiment illustrated in FIG. 9, the second operation clock CK2 may be adjusted with reference to the first operation clock CK1 having the longest delay time. As the first operation clock CK1 is used as one type of reference clock, a delay chain may not be included in the first transfer circuit 521 providing the first operation clock CK1 to the first unit circuit 531. For example, the delay chain 543 may be only included in the second transfer circuit 522 such that a clock skew between the first operation clock CK1 and the second operation clock CK2 may be removed, and a circuit area occupied by the clock tree 520 may be effectively reduced. Also, by reducing the number of the delay chains 543, process-voltage-temperature (PVT) fluctuations and jitter may be reduced, and a difference between a delay time generated by a replication circuit included in the clock generation circuit 510 and a delay time of the clock tree 520 may also be reduced.

In an example embodiment illustrated in FIG. 9, the clock tree 520 may include two transfer circuits 521 and 522, and the number of the first unit circuits 531 connected to the first transfer circuit 521 may be the same as the number of the second unit circuits 532 connected to the second transfer circuit 522, but an example embodiment thereof is not limited thereto. In example embodiments, the number of the transfer circuits included in the clock tree 520 and the number of unit circuits connected to the transfer circuits may be varied.

A delay time of the first transfer circuit 521 may be the longest delay time from among delay times between the internal clock generation circuit 510 and different ones of the unit circuits 530. In an example embodiment, the longest delay time may be shared by a group of unit circuits, for example, the first unit circuits 531.

Figure 10:
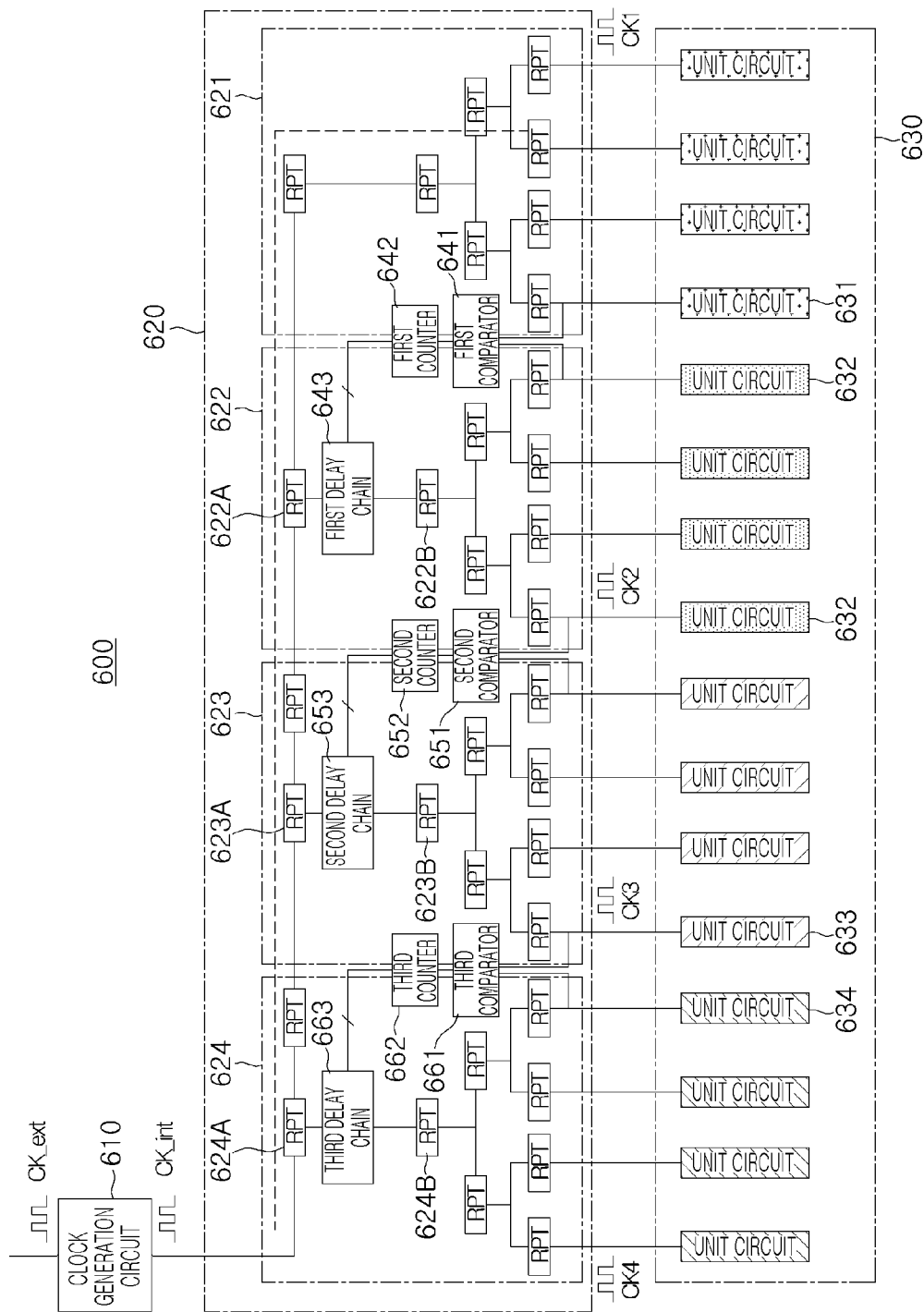
FIGS. 10 to 12 are diagrams illustrating operations of a semiconductor device according to an example embodiment of the present disclosure.
Figure 11:
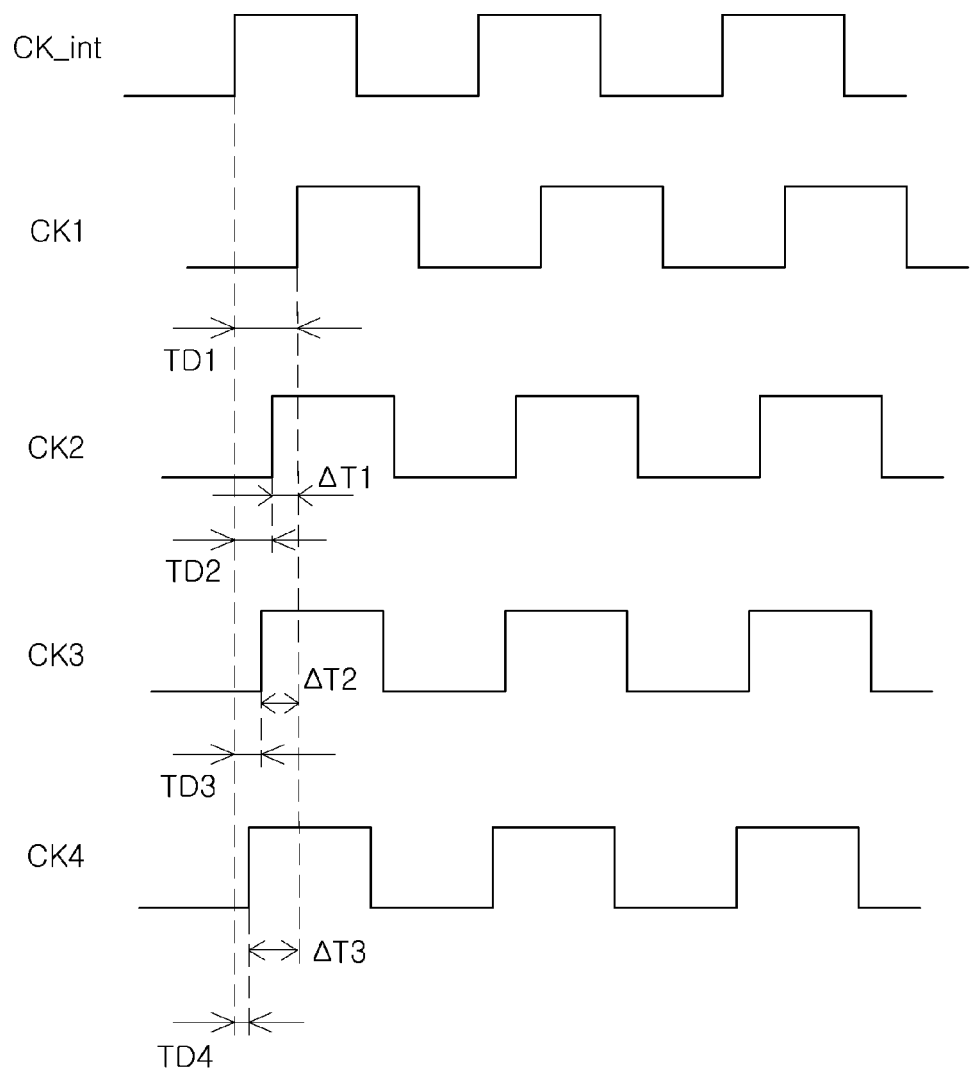
Figure 12:
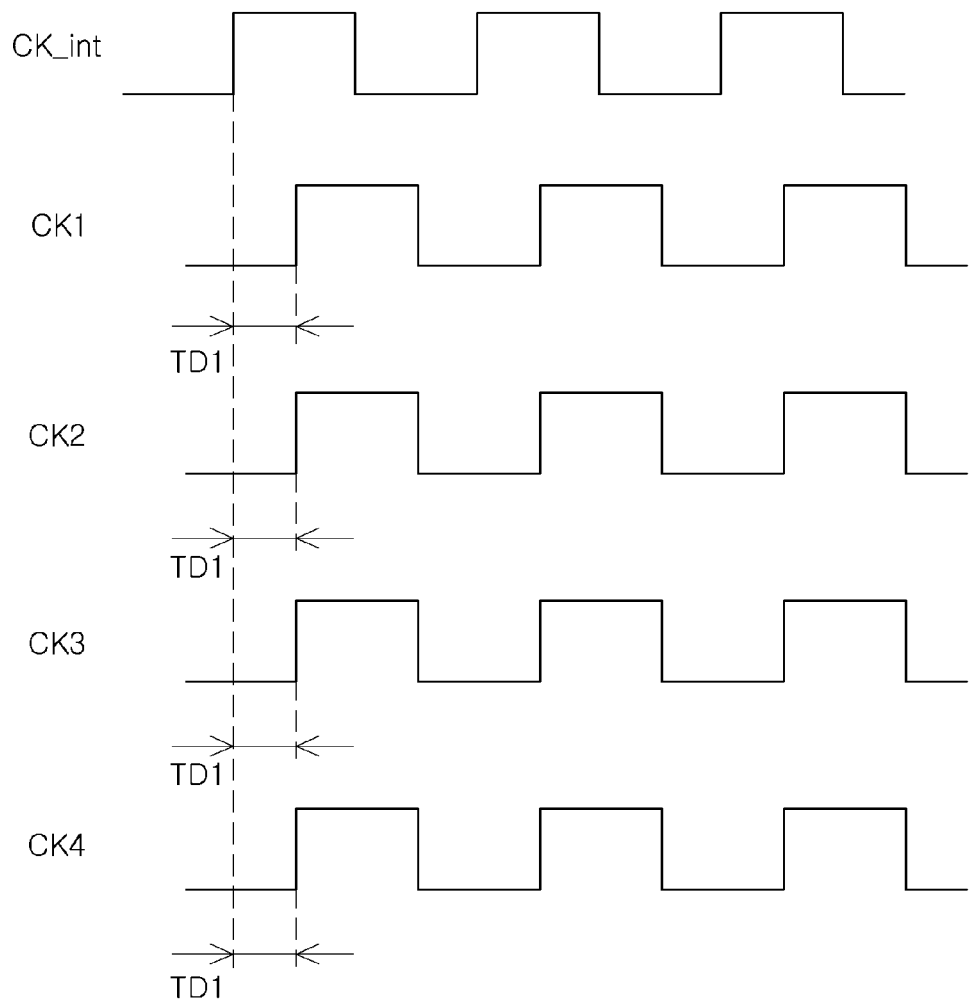

FIGS. 10 to 12 are diagrams illustrating operations of a semiconductor device according to an example embodiment.

Referring to FIG. 10, a semiconductor device 600 in an example embodiment may include a clock generation circuit 610, a clock tree 620, a plurality of unit circuits 630. The clock generation circuit 610 may generate an internal clock CK_int using an external clock CK_ext and the internal clock CK_int may be input to the clock tree 620.

The clock tree 620 may include first to fourth transfer circuits 621 to 624, and each of the first to fourth transfer circuits 621 to 624 may include a plurality of repeaters RPT. The first to fourth transfer circuits 621 to 624 may input operation clocks CK1 to CK4 to the plurality of unit circuits 630.

The unit circuits 630 may include first unit circuits 631, second unit circuits 632, third unit circuits 633, and fourth unit circuits 634. As an example, the first transfer circuit 621 may input the first operation clock CK1 to the first unit circuits 631, and the second transfer circuit 622 may input the second operation clock CK2 to the second unit circuits 632. The third transfer circuit 623 may input the third operation clock CK3 to the third unit circuits 633, and the fourth transfer circuit 624 may input the fourth operation clock CK4 to the fourth unit circuits 634.

Referring to FIG. 11, the operation clocks CK1 to CK4 may have different phases from each other. In an example embodiment, among the operation clocks CK1 to CK4, the first operation clock CK1 may have a first delay time TD1 which is the longest, and the fourth operation clock CK4 may have a fourth delay time TD4 which is the shortest, with reference to the internal clock CK_int. The second operation clock CK2 may have a second delay time TD2 which is the second longest, and the third operation clock CK3 may have a third delay time TD3 which is the second shortest. Accordingly, at least a portion of operation timings of the plurality of unit circuits 630 may not match each other, which may lead to degradation of performance of the semiconductor device 600.

In an example embodiment, a difference in delay times of the operation clocks CK1 to CK4 may be compensated using a delay compensation circuit. As an example, a difference in delay times of the operation clocks CK1 to CK4 may be reduced by increasing the second to fourth delay times TD2 to TD4 to match the first delay time TD1. Referring to FIG. 12, a delay compensation circuit may adjust the delay times of the operation clocks CK1 to CK4 to that of the first delay time TD1.

Referring back to FIGS. 10 and 11, a first comparator 641 may compare the first operation clock CK1 with the second operation clock CK2, and a first counter 642 may count an output of the first comparator 641 and may transfer the output to a first delay chain 643. The first delay chain 643 may be connected between a first repeater 622A and a second repeater 622B in the second transfer circuit 622, and may adjust the second operation clock CK2 by referring to an output of the first counter 642. As an example, the first counter 642 may count a first time difference ΔT1 corresponding to a difference between the first delay time TD1 and the second delay time TD2. The greater the first time difference ΔT1, the more the first delay chain 643 may increase the second delay time TD2. The first delay chain 643 may increase the second delay time TD2 to allow the first delay time TD1 and the second delay time TD2 to match each other.

Operations of a second comparator 651, a second counter 652, a second delay chain 653, a third comparator 661, a third counter 662, and a third delay chain 663 may be similar to operations of the first comparator 641, the first counter 642, and the first delay chain 643. As an example, the second delay chain 653 may increase the third delay time TD3 to match the second delay time TD2 by referring to a difference between the second delay time TD2 and the third delay time TD3. In an example embodiment, the second comparator 651 connected to the second delay chain 653 may compare the second operation clock CK2 adjusted by the first delay chain 643 with the third operation clock CK3. Accordingly, the second delay chain 653 may delay a phase of the third operation clock CK3 by a second time difference ΔT2 illustrated in FIG. 11.

Similarly, the third delay chain 663 may increase the fourth delay time TD4 to match the third delay time TD3 by referring to a difference between the third delay time TD3 and the fourth delay time TD4, and the third comparator 661 connected to the third delay chain 663 may compare the third operation clock CK3 adjusted by the second delay chain 653 with the fourth operation clock CK4. For example, the third comparator 661 may compare the third operation clock CK3 of which a phase has been delayed by the second time difference ΔT2 by the second delay chain 653 with the fourth operation clock CK4. Accordingly, the third delay chain 663 may increase the fourth delay time TD4 of the fourth operation clock CK4 by a third time difference ΔT3 and may synchronize the fourth operation clock CK4 with the other operation clocks CK1 to CK3 as illustrated in FIG. 12.

In an example embodiment illustrated in FIG. 10, the first delay chain 643, the second delay chain 653, and the third delay chain 663 may sequentially adjust the second operation clock CK2, the third operation clock CK3, and the fourth operation clock CK4 in accordance with the first operation clock CK1. Also, in an example embodiment, the first delay chain 643, the second delay chain 653, and the third delay chain 663 may simultaneously adjust the second operation clock CK2, the third operation clock CK3, and the fourth operation clock CK4. As an example, the second comparator 651 may compare the third operation clock CK3 with the first operation clock CK1, rather than with the second operation clock CK2, and the second delay chain 653 may adjust the third operation clock CK3 based on a result of the comparison. Also, the third comparator 661 may compare the fourth operation clock CK4 with the first operation clock CK1 and the third delay chain 663 may adjust the fourth operation clock CK4 based on a result of the comparison.

FIGS. 13 to 16 are diagrams illustrating operations of a semiconductor device according to an example embodiment.

Figure 13:
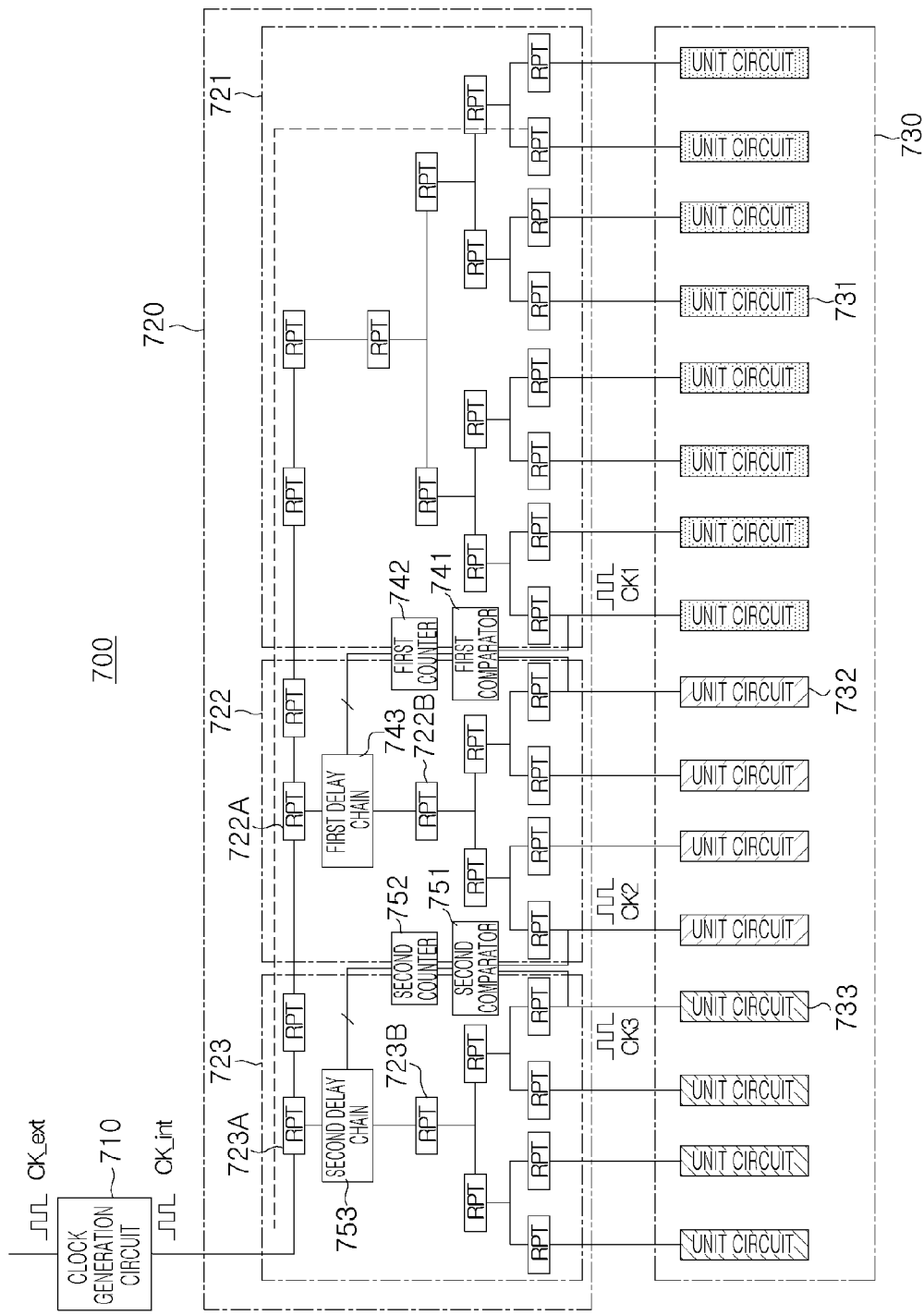
FIGS. 13 to 16 are diagrams illustrating operations of a semiconductor device according to an example embodiment of the present disclosure.

Referring to FIG. 13, a semiconductor device 700 in an example embodiment may include a clock generation circuit 710, a clock tree 720, and a plurality of unit circuits 730. The clock generation circuit 710 may generate an internal clock CK_int using an external clock CK_ext, and the internal clock CK_int may be input to the clock tree 720.

The clock tree 720 may include first to third transfer circuits 721 to 723, and each of the first to third transfer circuits 721 to 723 may include a plurality of repeaters RPT. The first to third transfer circuits 721 to 723 may input operation clocks CK1 to CK3 to the plurality of unit circuits 730. In an example embodiment, the number of the unit circuits connected to the first transfer circuit 721 may be different from the number of the unit circuits connected to each of the second and third transfer circuits 722 and 723.

Referring to FIG. 13, the number of the first unit circuits 731 connected to the first transfer circuit 721 may be greater than the number of the second unit circuits 732 connected to the second transfer circuit 722, and the number of the third unit circuits 733 connected to the third transfer circuit 723. Also, the first transfer circuit 721 may include the number of repeaters RPT greater than the number of repeaters RPT of the second transfer circuit 722 and the number of repeaters RPT of the third transfer circuit 733.

The semiconductor device 700 may include a delay compensation circuit for compensating a difference in delay times between the transfer paths provided by each of the first to third transfer circuits 721 to 723. The delay compensation circuit may include a first comparator 741, a first counter 742, a first delay chain 743, a second comparator 751, a second counter 752, a second delay chain 753, or the like. The first delay chain 743 may be connected between a first repeater 722A and a second repeater 722B included in the second transfer circuit 722, and the second delay chain 753 may be connected between a first repeater 723A and a second repeater 723B included in the third transfer circuit 723.

The unit circuits 730 may include first unit circuits 731, second unit circuits 732, and third unit circuits 733. As an example, a delay time by ten repeaters RPT may be reflected in the first operation clock CK1 input to each of the first unit circuits 731 with reference to the internal clock CK_int. A delay time by six repeaters RPT may be reflected in the second operation clock CK2 input to each of the second unit circuits 732 with reference to the internal clock CK_int. A delay time by four repeaters RPT may be reflected in the third operation clock CK3 input to each of the third unit circuits 733 with reference to the internal clock CK_int.

The first delay chain 743 may match phases of the first operation clock CK1 and the second operation clock CK2 by delaying the second operation clock CK2 with reference to a result of the comparison between the first operation clock CK1 and the second operation clock CK2. As an example, when it is assumed that delay times occurring in the repeaters RPT are the same, the first delay chain 743 may delay the internal clock CK_int by a delay time by the four repeaters RPT. Similarly, the second delay chain 753 may delay the internal clock CK_int by a delay time by six repeaters RPT.

Figure 14:
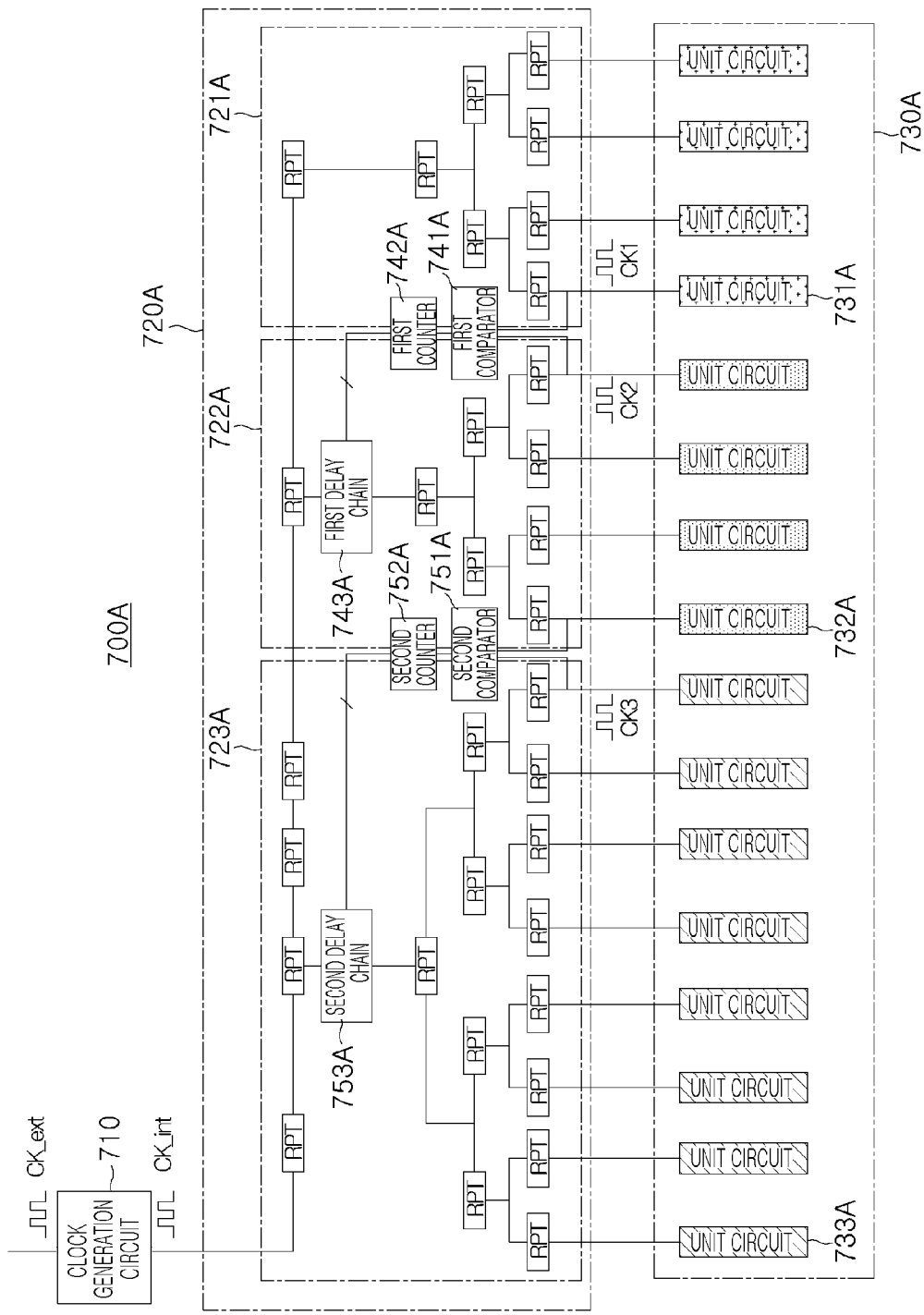

Referring to FIG. 14, a semiconductor device 700A in an example embodiment may include a clock generation circuit 710, a clock tree 720A, and a plurality of unit circuits 730A. The clock tree 720A may include first to third transfer circuits 721A-723A, and each of the first to third transfer circuits 721A-723A may include a plurality of repeaters RPT.

The first to third transfer circuits 721A-723A may be connected to the plurality of unit circuits 730. In an example embodiment illustrated in FIG. 14, the number of the first unit circuits 731A connected to the first transfer circuit 721A may be the same as the number of the second unit circuits 732A connected to the second transfer circuit 722A. In an example embodiment, the number of the third unit circuits 733A connected to the third transfer circuit 723A may be greater than the number of the first unit circuits 731A and the number of the second unit circuits 732A.

Operations of a delay compensation circuit may be similar to an example embodiment described with reference to FIG. 13. The first operation clock CK1 may be delayed by a delay time generated by nine repeaters RPT with reference to the internal clock CK_int. The second operation clock CK2 may be delayed from the internal clock CK_int by a delay time generated by eight repeaters RPT. Accordingly, a first delay chain 743A may further delay the second operation clock CK2 by a delay time corresponding to a single repeater RPT and may synchronize the second operation clock CK2 with the first operation clock CK1. Similarly, a second delay chain 753A may further delay the third operation clock CK3 by a delay time corresponding to four repeaters RPT.

Figure 15:
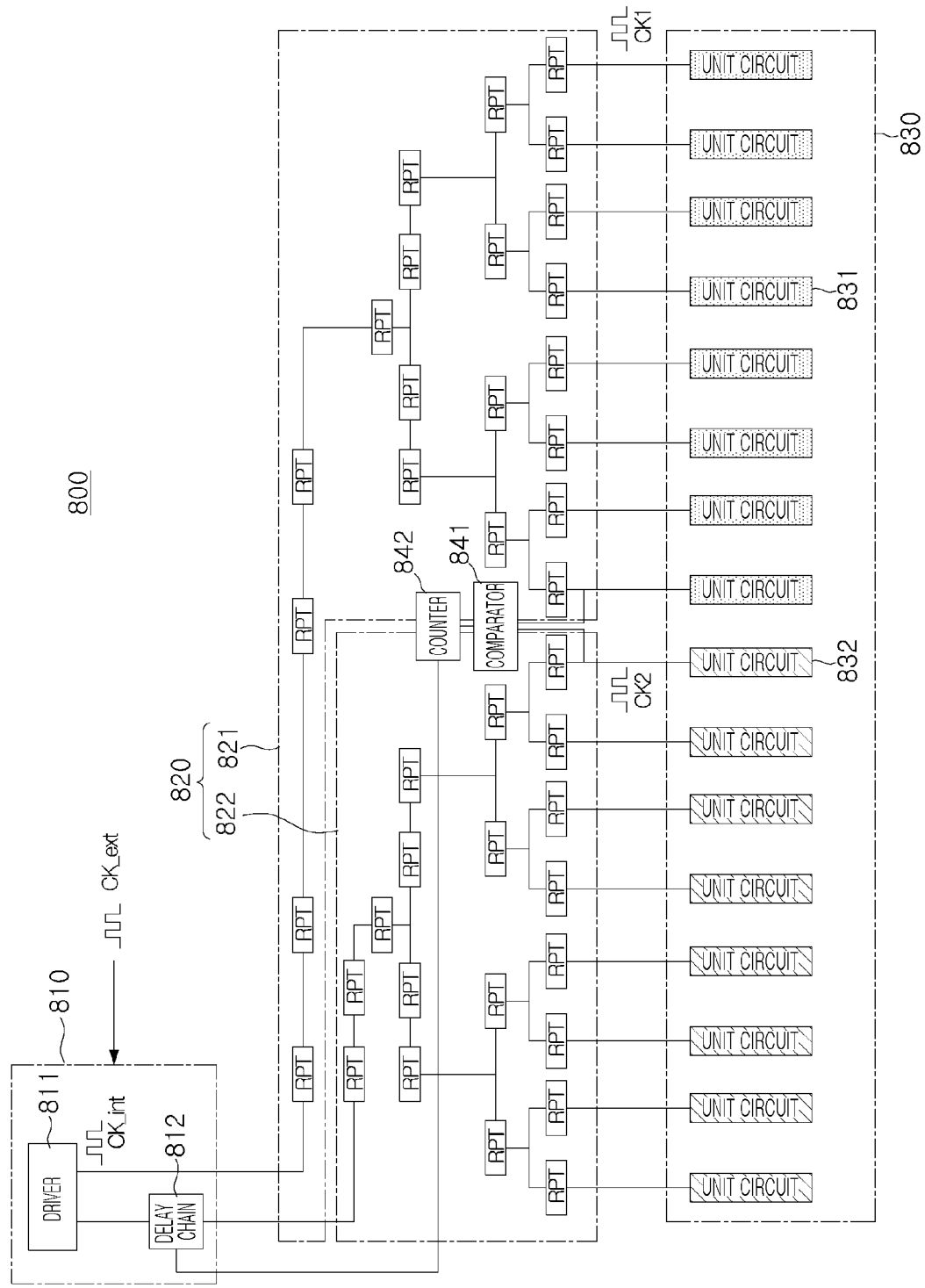

Referring to FIG. 15, a semiconductor device 800 in an example embodiment may include a clock generation circuit 810, a clock tree 820, and a plurality of unit circuits 830. The clock tree 820 may include a first transfer circuit 821 and a second transfer circuit 822. The unit circuits 830 may include first unit circuits 831 and second unit circuits 832. The first transfer circuit 821 may input the first operation clock CK1 to the first unit circuits 831, and the second transfer circuit 822 may input the second operation clock CK2 to the second unit circuits 832.

Differently from the aforementioned example embodiment, in an example embodiment illustrated in FIG. 15, a delay chain 812 may be included in the clock generation circuit 810, rather than being included in the clock tree 820. Referring to FIG. 15, the clock generation circuit 810 may include a driver 811 for generating the internal clock CK_int using the external clock CK_ext, and outputting the internal clock CK_int. The driver 811 may include a first output terminal connected to the first transfer circuit 821 and a second output terminal connected to the second transfer circuit 822 through the delay chain 812 connected between the second output terminal and the second transfer circuit 822. Accordingly, in an example embodiment illustrated in FIG. 15, the first transfer circuit 821 and the second transfer circuit 822 may be connected to an output terminal of the clock generation circuit 810 in parallel.

Referring to FIG. 15, the first operation clock CK1 may be delayed by a delay time corresponding to nine repeaters RPT with reference to the internal clock CK_int. The second operation clock CK2 may be delayed by a delay time corresponding to seven repeaters RPT with reference to the internal clock CK_int. Accordingly, as the delay chain 812 further delays the internal clock CK_int by a delay time corresponding to two repeaters RPT, the first operation clock CK1 and the second operation clock CK2 may be synchronized with each other.

The additional delay time obtained by further delaying the internal clock CK_int by the delay chain 812 may be determined by a comparator 841 and a counter 842. The comparator 841 may compare the first operation clock CK1 with the second operation clock CK2, and the counter 842 may count an output of the comparator 841. Accordingly, the delay chain 812 may determine an additional delay time in consideration of fluctuations in the operation clocks CK1 and CK2 according to changes in operation environment such as a temperature, voltage, and the like, and the first operation clock CK1 and the second operation clock CK2 may be accurately synchronized with each other.

Figure 16:
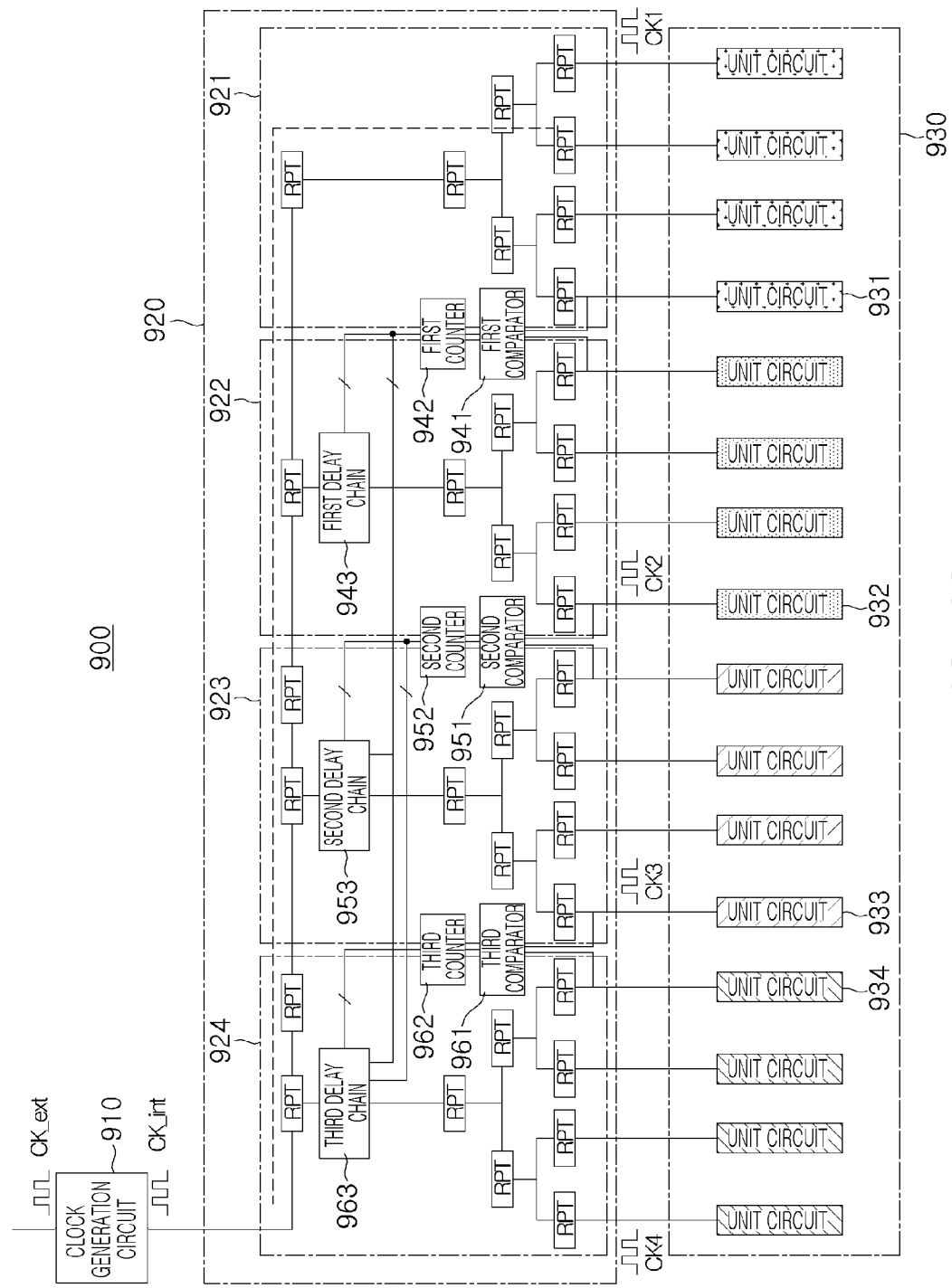

In an example embodiment illustrated in FIG. 16, a semiconductor device 900 may include a clock generation circuit 910, a clock tree 920, and a plurality of unit circuits 930. The clock tree 920 may include first to fourth transfer circuits 921 to 924, and the first to fourth transfer circuits 921 to 924 may output first to fourth operation clocks CK1 to CK4. An operation for compensating a difference in delay times of the first to fourth transfer circuits 921 to 924 may be understood with reference to an example embodiment described with reference to FIG. 10.

In an example embodiment illustrated in FIG. 16, an output of the first counter 942 may be input to the first delay chain 943 and also to the second delay chain 953 and the third delay chain 963. Also, an output of the second counter 952 may be input to the second delay chain 953 and the third delay chain 963.

Referring to FIG. 16, the first operation clock CK1 may be a clock delayed by a delay time corresponding to nine repeaters RPT with reference to the internal clock CK_int, and the second operation clock CK2 may be a clock delayed by a delay time corresponding to eight repeaters RPT with reference to the internal clock CK_int. The third operation clock CK3 may be a clock delayed by a delay time corresponding to six repeaters RPT with reference to the internal clock CK_int, and the fourth operation clock CK4 may be a clock delayed by a delay time corresponding to fourth repeaters RPT with reference to the internal clock CK_int.

As the first comparator 941 compares the first operation clock CK1 with the second operation clock CK2, and the second comparator 951 compares the second operation clock CK2 with the third operation clock CK3, the adjustment of the third operation clock CK3 may not be completed before adjusting the second operation clock CK2 using the first operation clock CK1. For example, the second operation clock CK2, the third operation clock CK3, and the fourth operation clock CK4 may need to be adjusted in order, which may cause an increase of time required for a synchronization operations of the operation clocks CK1-CK4. In an example embodiment illustrated in FIG. 16, as outputs of the counters 942, 952, and 962 are transmitted to subordinated delay chains 943, 953, and 963, operations of synchronization of the operation clocks CK1-CK4 by the delay chains 943, 953, and 963 may be simultaneously performed.

As an example, the first counter 942 may also transmit first information obtained by counting a delay time of a single repeater RPT to the first delay chain 943 and also to the second and third delay chains 953 and 963, which are subordinated. Also, the second counter 952 may transmit second information obtained by counting a delay time corresponding to two repeater RPT to the second and third delay chains 953 and 963.

When the clock generation circuit 910 generates the internal clock CK_int and the clock tree 920 inputs the operation clocks CK1-CK4 to the unit circuits 930, the first delay chain 943 may receive first information from the first counter 942. Also, the second delay chain 953 may receive the first information from the first counter 942, and may receive second information from the second counter 952. The first delay chain 943 may delay the second operation clock CK2 by a delay time corresponding to a single repeater RPT based on the first information. The second delay chain 953 may delay the third operation clock CK3 by a delay time corresponding to three repeaters RPT based on the first information and the second information. Accordingly, the second operation clock CK2 and the third operation clock CK3 may be simultaneously synchronized with the first operation clock CK1. The third delay chain 963 may operate similarly to the second delay chain 953.

In an example embodiment illustrated in FIG. 16, the second delay chain 953 may simultaneously receive the first information and the second information from the first counter 942 and the second counter 952. As an example, the second delay chain 953 may include a delay chain delaying the second operation clock CK2 according to the first information and a delay chain delaying the second operation clock CK2 according to the second information. Accordingly, the second delay chain 953 may have an area relatively greater than that of the first delay chain 943. Similarly, the third delay chain 963 may have an area greater than those of the first delay chain 943 and the second delay chain 953.

FIGS. 17 to 20 are diagrams illustrating operations of a semiconductor device according to an example embodiment.

Figure 17:
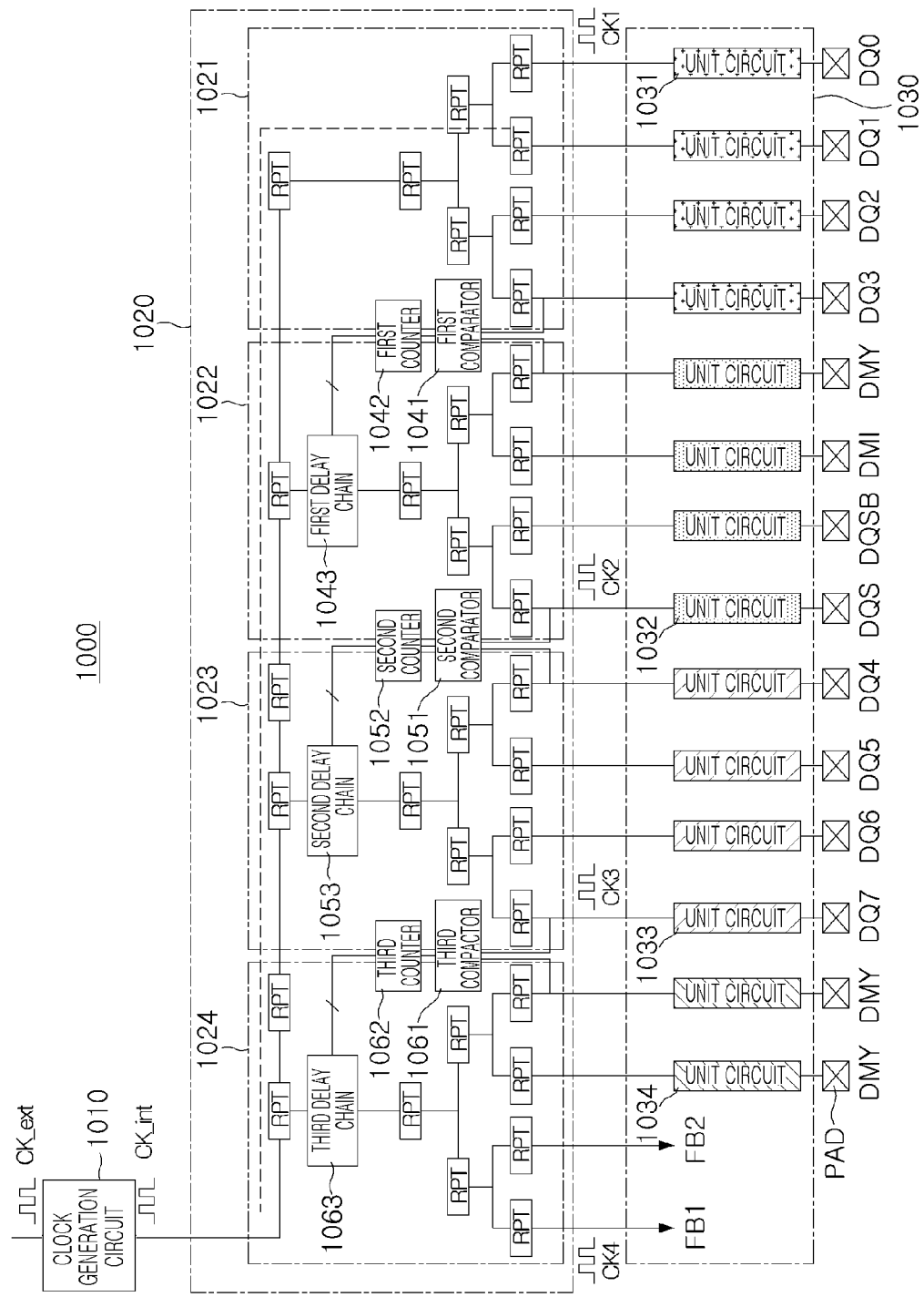
FIGS. 17 to 20 are diagrams illustrating operations of a semiconductor device according to an example embodiment of the present disclosure.

Referring to FIG. 17, a semiconductor device 1000 in an example embodiment may be implemented as a memory device which may store data. A clock generation circuit 1010 may generate an internal clock CK_int using an external clock CK_ext, and the internal clock CK_int may be input to unit circuits 1030 through a clock tree 1020. The external clock CK_ext may be a clock input from a memory controller. The unit circuits 1030 may be connected to a plurality of pads PAD. A plurality of data signals DQ0-DQ7 and data strobe signals DQS and DQSB may be input to and output from the unit circuits 1030 through the pads PAD. At least one of the pads PAD may be assigned as a dummy DMY. Also, at least one of the pad PADs may be assigned as a DMI pad DMI. The DMI pad DMI may be disposed by a predetermined bit unit, and may be configured as a pad for providing a data bus inversion DBI function.

The clock tree 1020 may include first to fourth transfer circuits 1021-1024, and the first to fourth transfer circuits 1021-1024 may be connected to the first to fourth unit circuits 1031-1034. At least a portion of the first to fourth unit circuits 1031-1034 may have different structures. In an example embodiment, a structure of each of the first to fourth unit circuits 1031-1034 may be determined according to a signal input to and output from the pad PAD.

Figure 18:
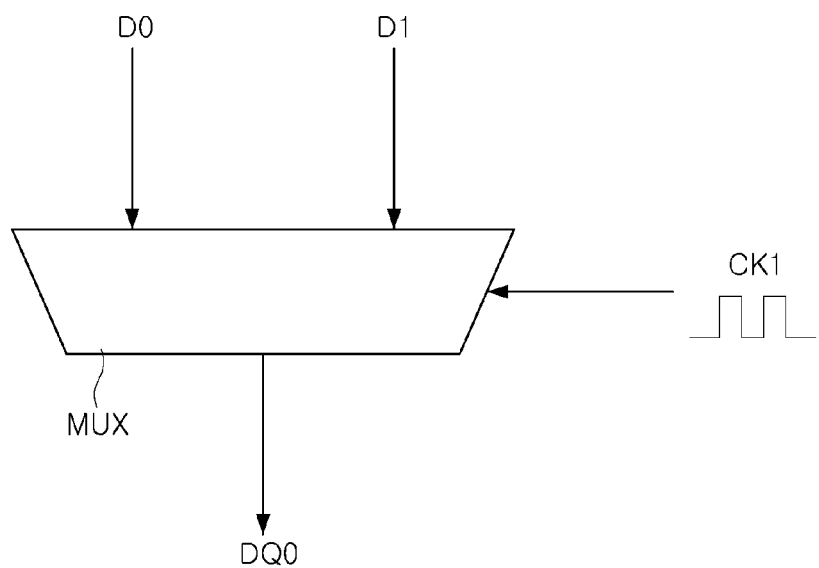

Referring to FIG. 18, the first unit circuit 1031 may serialize first data D0 and second data D1 and may output the data. As an example, the first data D0 and the second data D1 may be input to a multiplexer MUX, and the multiplexer MUX may alternately output the first data D0 and the second data D1 in response to the first operation clock CK1. The first data D0 and the second data D1 may be serialized and may be output through the pad PAD as a first data signal DQ0. In an example embodiment, a frequency of the first operation clock CK1 may be twice an output frequency of each of the first data D0 and the second data D1.

Referring back to FIG. 17, at least one of the first to fourth transfer circuits 1021-1024 may have an output terminal which is not connected to the unit circuits 1030. As an example, a portion of output terminals of the fourth transfer circuit 1034 may not be connected to the unit circuits 1030, and may output feedback signals FB1 and FB2. The feedback signals FB1 and FB2 may be input to the clock generation circuit 1010. As an example, the first feedback signal FB1 may be input to a duty cycle corrector (DCC), and the second feedback signal FB2 may be a signal for providing a feedback for a delay time TSAC until actual data signals DQ0-DQ7 are output from the internal clock CK_int, and may be input to a replication circuit of the clock generation circuit 1010.

Operations of the clock tree 1020 may be understood with reference to the aforementioned example embodiments. The first comparator 1041 may compare the first operation clock CK1 output by the first transfer circuit 1021 with the second operation clock CK2 output by the second transfer circuit 1022, and the first counter 1042 may count an output of the first comparator 1041 and may transfer the output to the first delay chain 1043. The first delay chain 1043 may further delay the second operation clock CK2 based on the information received from the first counter 1042. The first delay chain 1043 in an example embodiment illustrated in FIG. 17 may delay the second operation clock CK2 by a delay time generated when the internal clock CK_int passes through a single repeater RPT.

In the description below, an operation of the semiconductor device 1000 will be described in greater detail with reference to FIGS. 19 and 20.

Figure 19:
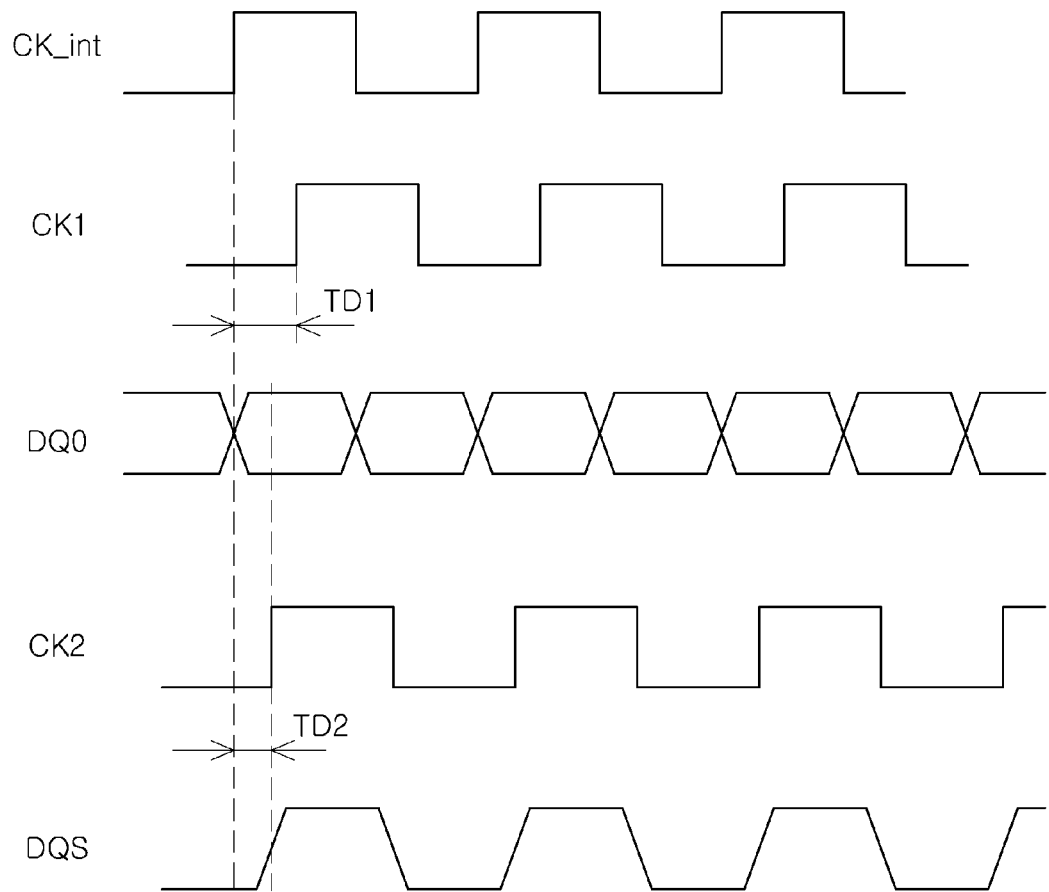
Figure 20:
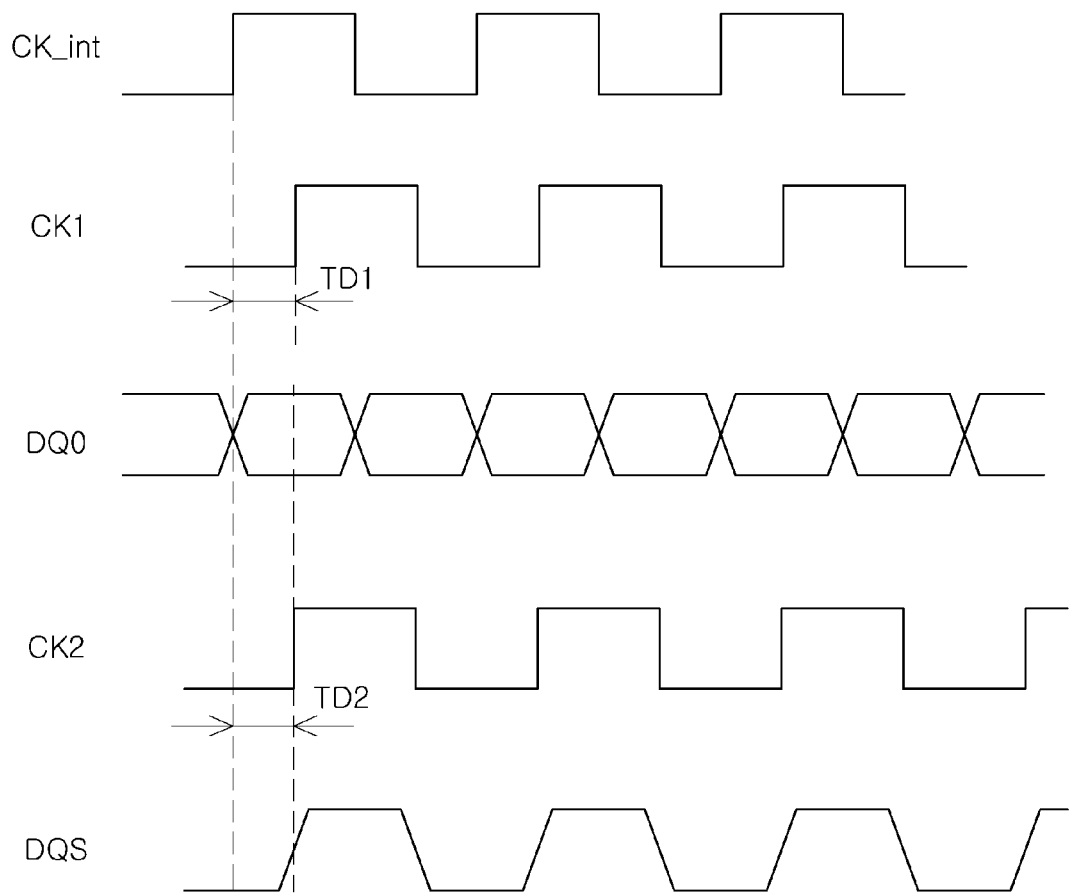

Referring to FIG. 19, an operation before a difference between delay times of the operation clocks CK1-CK4 is adjusted in the clock tree 1020 will be described. Referring to FIG. 19, the first operation clock CK1 may be a clock delayed by a first delay time TD1 with reference to an internal clock CK_int, and the second operation clock CK2 may be a clock delayed by the second delay time TD2 with reference to an internal clock CK_int. The first delay time TD1 may be greater than the second delay time TD2.

The first data signal DQ0 may be synchronized with the first operation clock CK1 and may be output, and the data strobe signal DQS may be synchronized with the second operation clock CK2 and may be output. As a phase of the first operation clock CK1 may not match a phase of the second operation clock CK2 by a difference between the first delay time TD1 and the second delay time TD2, the first data signal DQ0 and the data strobe signal DQS may not be accurately synchronized with each other as illustrated in FIG. 19. To accurately synchronize the first data signal DQ0 and the data strobe signal DQS with each other, a rising edge and a falling edge of the data strobe signal DQS may need to match the first data signal DQ0.

In an example embodiment, the first operation clock CK1 and the second operation clock CK2 may be synchronized with each other by delaying the second operation clock CK2 by the first delay chain 1043 by a difference between the first delay time TD1 and the second delay time TD2. Referring to FIG. 20, the first operation clock CK1 and the second operation clock CK2 may be synchronized with each other by the first delay chain 1043. Accordingly, the second operation clock CK2 may be delayed by the first delay time TD1 with reference to the internal clock CK_int, and the first data signal DQ0 and the data strobe signal DQS may be synchronized with each other such that reliability of the semiconductor device 1000.

Figure 21:
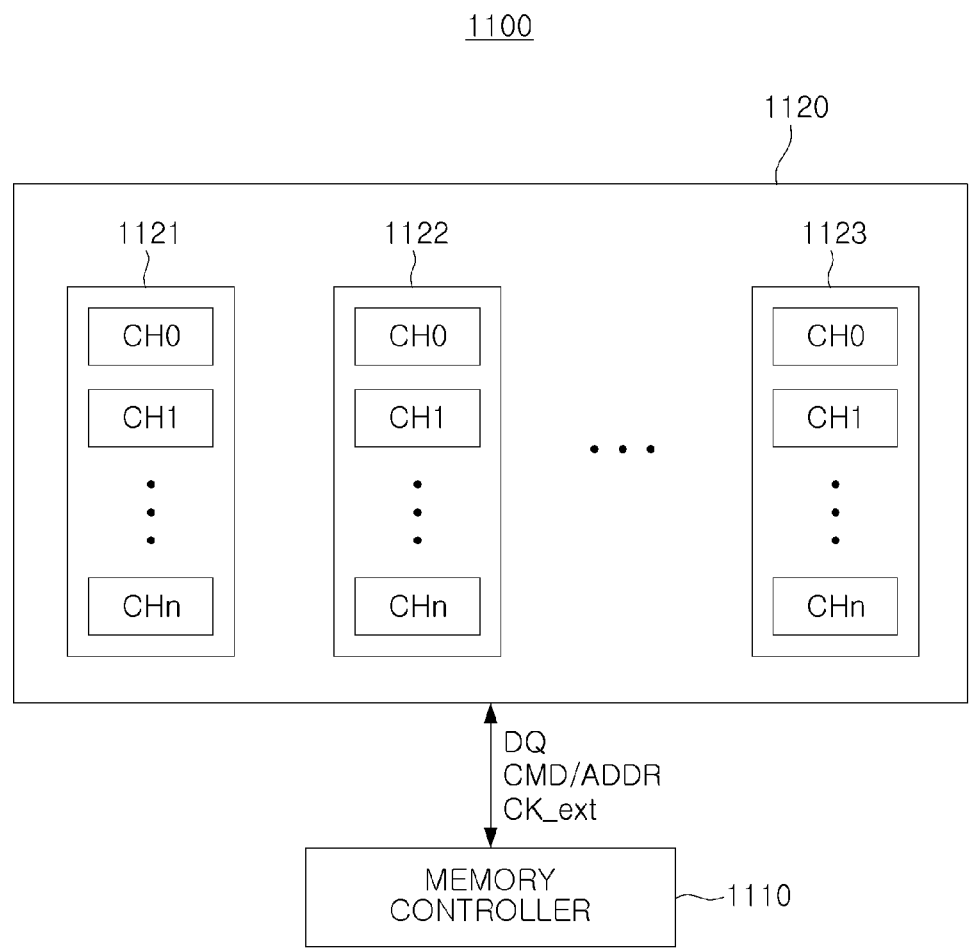
FIGS. 21 and 22 are diagrams illustrating a semiconductor device according to an example embodiment of the present disclosure.
Figure 22:
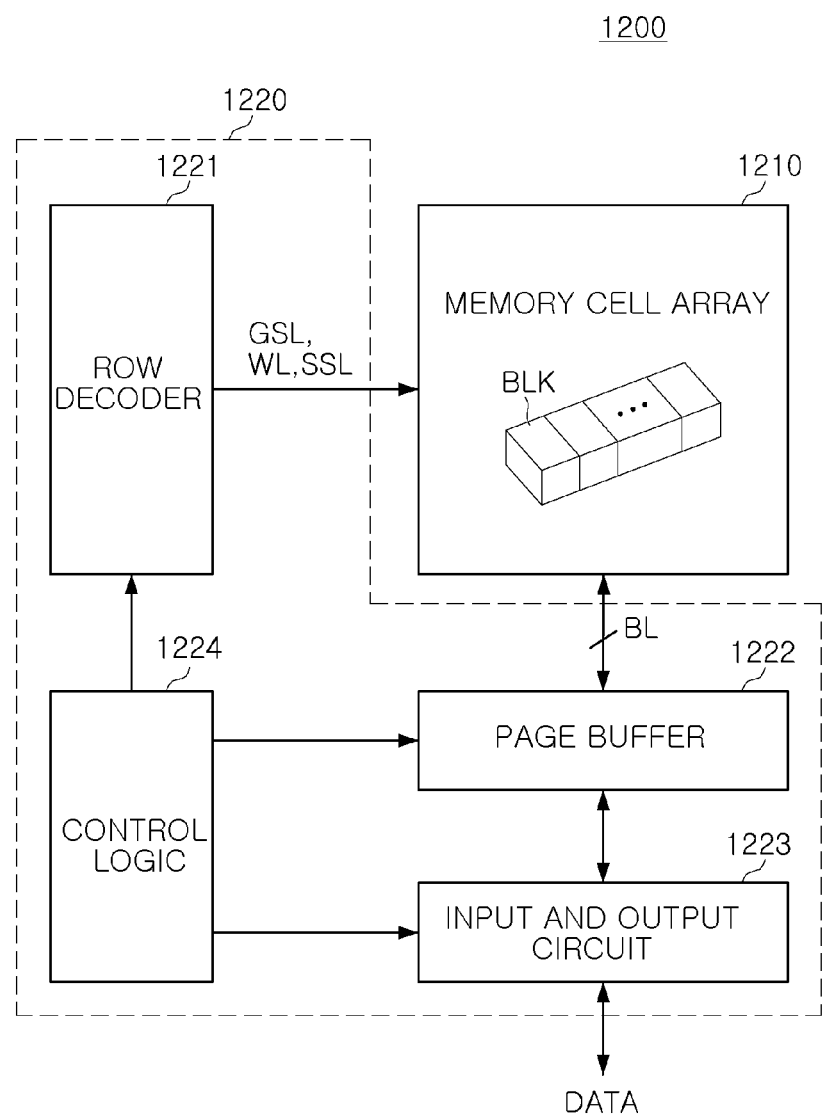

FIGS. 21 and 22 are diagrams illustrating a semiconductor device according to an example embodiment.

In an example embodiments illustrated in FIGS. 21 and 22, each of semiconductor devices 1100 and 1200 may be implemented by a memory device. As an example, the semiconductor device 1100 in FIG. 21 may include a volatile dynamic random access memory (DRAM), and the semiconductor device 1200 in FIG. 22 may include a non-volatile flash memory device. The semiconductor devices 1100 and 1200 in example embodiments may be widely applied to devices operating by a certain internal clock other than the memory devices.

Referring to FIG. 21, the semiconductor device 1100 may include a memory controller 1110 and a memory device 1120, and the memory device 1120 may include a plurality of memory chips 1121-1123. Memory cells may be divided into a plurality of channels CH0-CHn in each of the plurality of memory chips 1121-1123. The memory controller 1110 may input signals for controlling the memory device 1120, such as a data signal DQ, a command/address signal CMD/ADDR, and an external clock CK_ext, for example, to the memory device 1120.

The memory device 1120 may include a clock generation circuit, a clock tree, and the like, described in the aforementioned example embodiments. The clock generation circuit may generate an internal clock using the external clock CK_ext, and the clock tree may transfer an internal clock to unit circuits operating while being synchronized with an internal clock.

The internal clock from the clock tree, which is input to the unit circuits may be delayed by a certain delay time from the internal clock generated by the clock generation circuit. At least a portion of the transfer paths provided by the clock tree between the clock generation circuit and the unit circuits may have different delay times. In an example embodiment, the clock tree may compare a first delay time detected from the first transfer path, which is the longest, with a second delay time detected by the second transfer path, which is relatively short. The clock tree may increase the second delay time in accordance with the first delay time such that a difference in delay times between the internal clock output through the first transfer path and the internal clock output through the second transfer path may be reduced.

In an example embodiment illustrated in FIG. 22, the semiconductor device 1200 may include a memory cell array 1210 and a peripheral circuit 1220, and the memory cell array 1210 may include a plurality of memory blocks BLK. The peripheral circuit 1220 may include a row decoder 1221, a page buffer 1222, an input and output circuit 1223, and a control logic 1224. The row decoder 1221 may be connected to the memory cell array 1210 through ground select lines GSL, word lines WL, and string select lines SSL, and the page buffer 1222 may be connected to the memory cell array 1210 through bit lines BL.

The control logic 1224 may include a clock generation circuit, a clock tree, and the like described in the aforementioned example embodiments. The clock generation circuit may generate an internal clock using an external clock received from an external entity, and the clock tree may transmit an internal clock to circuits operating while being synchronized with the internal clock. The clock tree may provide a plurality of transfer paths having different delay times, and a delay compensation circuit for compensating a difference in delay times between the transfer paths may be included in the control logic 1224. The delay compensation circuit may compensate for a difference in delay times by increasing the other delay time with reference to the longest delay time generated in the clock tree.

Figure 23:
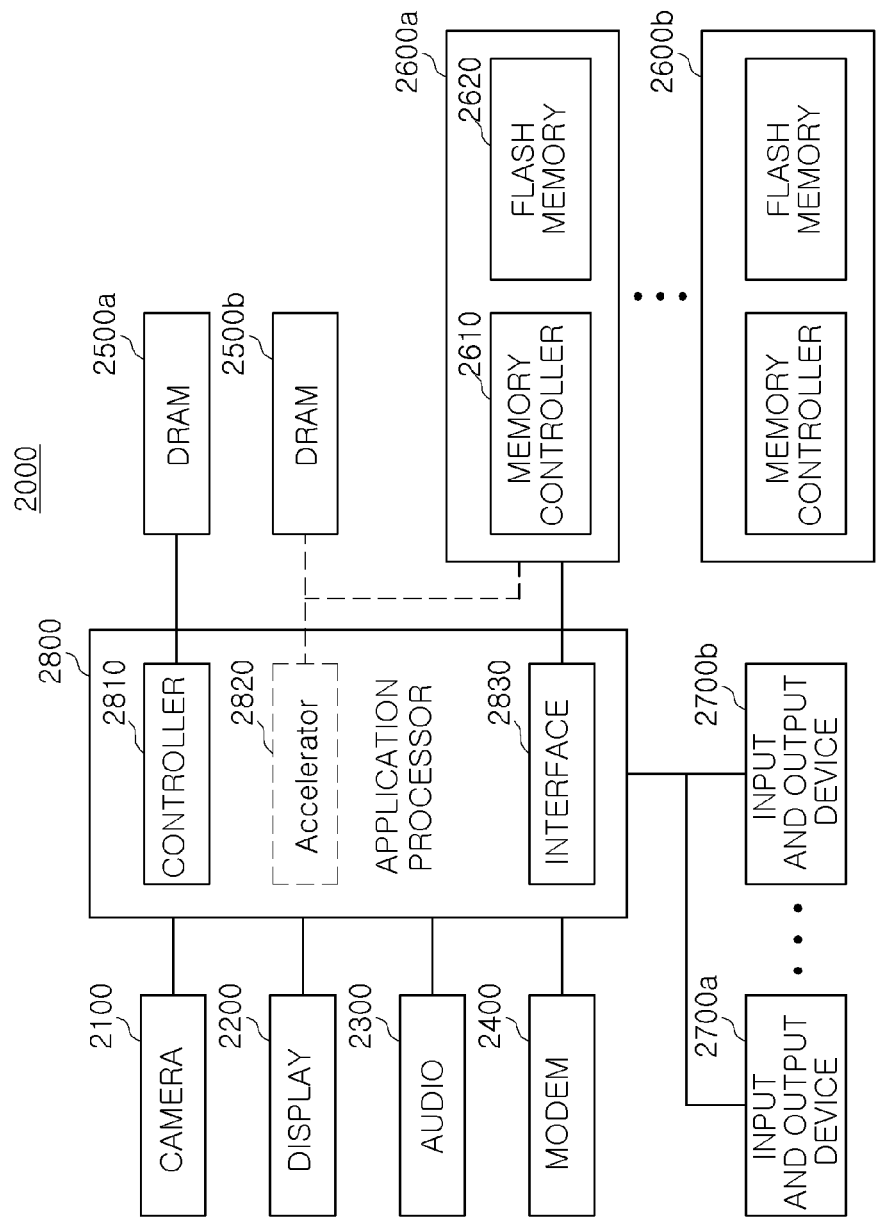
FIG. 23 is a block diagram illustrating an electronic device including a semiconductor device according to an example embodiment of the present disclosure.

FIG. 23 is a block diagram illustrating an electronic device including a semiconductor device according to an example embodiment.

Referring to FIG. 23, a mobile system 2000 may include a camera 2100, a display 2200, an audio processing unit 2300, a modem 2400, DRAMs 2500a and 2500b, flash memory devices 2600a and 2600b, input and output devices 2700a and 2700b, and an application processor 2800 (hereinafter, "AP").

The mobile system 2000 may be implemented as a laptop computer, a portable terminal, a smartphone, a tablet PC, a wearable device, a healthcare device, or an Internet-of-Things (IoT) device. Also, the mobile system 2000 may be implemented as a server or a personal computer.

Various components included in the mobile system 2000 may operate while being synchronized with a predetermined clock. For example, the display 2200 may display a screen according to a predetermined refresh rate, and may include a gate driver, a source driver, or the like, which operate according to a clock to implement the refresh rate. In addition, the DRAMs 2500a and 2500b and the flash memory devices 2600a and 2600b may operate according to a predetermined clock to store and read data at a predetermined speed or to exchange data with other external devices. The input and output devices 2700a and 2700b and the application processor 2800 may also operate according to a predetermined clock.

Semiconductor devices in the embodiments disclosed herein may be applied to components operating while being synchronized with a clock in the mobile system 2000. For example, the semiconductor device of an example embodiment may be applied to a circuit for generating an internal clock in the display 2200 and transferring the internal clock to a gate driver and/or a source driver. The semiconductor device of an example embodiment may also be applied to an input and output interface which exchanges image data between the camera 2100 and the AP 2800, and/or between the display 2200 and the AP 2800. In addition, the semiconductor device of an example embodiment may also be applied to the other components, including the DRAMs 2500a and 2500b and the flash memory devices 2600a and 2600b.

The camera 2100 may obtain a still image or a video according to a user's control. The mobile system 2000 may acquire specific information using a still image/video obtained by the camera 2100, or may convert the still image/video into different types of data such as text and may store the data. Alternatively, the mobile system 2000 may recognize a character string included in a still image/video obtained by the camera 2100 and may provide a text or audio translation corresponding to the character string. As such, the use of the camera 2100 in the mobile system 2000 has been increasingly diversified. In an example embodiment, the camera 2100 may transmit data such as a still image/video to the AP 2800 according to a D-Phy or C-Phy interface based on the MIPI standard.

The camera 2100 may include a plurality of cameras having different fields of view or aperture values. In addition, the camera 2100 may further include a camera which may generate a depth image using depth information of a subject and/or background, in addition to a camera which generates an actual image by imaging a subject.

The display 2200 may be implemented by a liquid crystal display (LCD), an organic light emitting diodes (OLED) display, an active-matrix organic light-emitting diode (AM-OLED), a plasma display panel (PDP), a field emission display (FED), electronic paper, and the like. In an example embodiment, the display 2200 may be used as an input device of the mobile system 2000 by providing a touch screen function. Also, the display 2200 may be provided integrally with a fingerprint sensor, or the like, and may provide a security function of the mobile system 2000. In an example embodiment, the AP 2800 may transmit image data to be displayed on the display 2200 to the display 2200 according to a D-Phy or C-Phy interface based on the MIPI standard.

The audio processing unit 2300 may process audio data stored in the flash memory devices 2600a and 2600b or audio data included in content received from an external entity through the modem 2400 or the input and output devices 2700a and 2700b. For example, the audio processing unit 2300 may perform various processes such as coding/decoding, amplification, and noise filtering for audio data.

The modem 2400 may modulate and transmit a signal for transmission and reception of wired/wireless data, and may also restore an original signal by demodulating a signal received from an external entity. The input/output devices 2700a and 2700b may be devices which may provide digital input and output, and may include a port which may be able to be connected to an external recording medium, an input device such as a touch screen or a mechanical button key, an output device which may output vibration by a haptic method, and the like. In an example embodiment, the input and output devices 2700a and 2700b may be connected to an external recording medium through ports such as a USB, a lightning cable, an SD card, a micro SD card, a DVD, a network adapter, or the like.

The AP 2800 may control overall operations of the mobile system 2000. Specifically, the AP 2800 may control the display 2200 such that a part of the contents stored in the flash memory devices 2600a and 2600b may be displayed on the screen. Also, when a user input is received through the input and output devices 2700a and 2700b, the AP 2800 may perform a control operation corresponding to the user input.

The AP 2800 may be provided as a system-on-chip (SoC) that drives an application program, an operating system (OS), or the like. Further, the AP 2800 may be included in a single semiconductor package with other devices included in the mobile system 2000, such as the DRAMs 2500a and 2500b, a flash memory 2620, and/or a memory controller 2610, for example. For example, at least one device different from the AP 2800 may be provided in a form of package such as package on package (PoP), ball grid arrays (BGAs), chip scale packages (CSPs), system in package (SIP), multi-chip package (MCP), wafer-level fabricated package (WFP), wafer-level processed stack package (WSP), or the like. The kernel of an operating system driven on the AP 2800 may include an input and output scheduler and a device driver for controlling the flash memory devices 2600a and 2600b. The device driver can control access performance of the flash memory devices 2600a and 2600b by referring to the number of synchronous queues managed by the input and output scheduler, or may control a CPU mode in an SoC, a dynamic voltage and frequency scaling (DVFS) level, and the like.

In an example embodiment, the AP 2800 may include a processor block which executes a computation or drives an application program and/or an operating system, and various other peripheral components connected to a processor block through a system bus. Peripheral components may include a memory controller, an internal memory, a power management block, an error detection block, and a monitoring block. The processor block may include one or more cores, and when a plurality of cores are included in the processor block, each of the cores may include a cache memory, and a common cache shared by the cores may be included in the processor block.

In an example embodiment, the AP 2800 may include an accelerator block 2820 which is a dedicated circuit for AI data computation. Alternatively, in example embodiments, a separate accelerator chip may be provided separately from the AP 2800, and a DRAM 2500b may be additionally connected to the accelerator block 2820 or the accelerator chip. The accelerator block 2820 may be a function block which professionally performs a specific function of the AP 2800, and may include a graphics processing unit (GPU) for professionally performing graphics data processing, a neural processing unit (NPU) for professionally performing AI calculation and inference, a data processing unit (DPU) for professionally performing data transmission.

In an example embodiment, the mobile system 2000 may include a plurality of DRAMs 2500a and 2500b. In an example embodiment, the AP 2800 may include a controller 2810 for controlling the DRAMs 2500a and 2500b, and the DRAM 2500a may be directly connected to the AP 2800.

The AP (2800) may control the DRAM by setting a command and a mode register set (MRS) conforming to the JEDEC standard, and may set specifications and functions required by the mobile system 2000, such as low voltage/high speed/reliability and DRAM interface protocol for CRC/ECC and may perform communication. For example, the AP 2800 may communicate with the DRAM 2500a through an interface conforming to JEDEC standard standards such as LPDDR4 and LPDDR5. Alternatively, the AP 2800 may set a new DRAM interface protocol for an accelerator chip, which may be separately arranged from the accelerator block 2820 or the AP 2800, to control the DRAM 2500 for an accelerator having a bandwidth higher than that of the DRAM 2500a, and may perform communication.

FIG. 23 only illustrates the DRAM 2500a and 2500b, but an example embodiment of the mobile system 2000 is not limited thereto, and a bandwidth and a reaction speed of the AP 2800 or the accelerator block 2820 and memories other than the DRAMs 2500a and 2500b may be included in the mobile system 2000 depending on voltage conditions. As an example, the controller 2810 and/or the accelerator block 2820 can control various memories such as a PRAM, an SRAM, an MRAM, a RRAM, a FRAM, a hybrid RAM, and the like. The DRAMs 2500a and 2500b may have latency relatively smaller than those of the input and output devices 2700a and 2700b or the flash memory devices 2600a and 2600b and a bandwidth higher than those of the input and output devices 2700a and 2700b or the flash memory devices 2600a and 2600b. The DRAM 2500a and 2500b may be initialized at a power-on point of the mobile system 2000, and when an operating system and application data are loaded, the DRAMs 2500a and 2500b may be used as a temporary storage location for the operating system and application data or as an execution space for various software codes.

In the DRAMs 2500a and 2500b, addition/subtraction/multiplication/dividing arithmetic operations and vector operation, address operation, or FFT operation data may be stored. In another example embodiment, the DRAMs 2500a and 2500b may be provided as a processing in memory (PIM) equipped with a calculation function. For example, a function to be used for inference in the DRAMs 2500a and 2500b may be performed. The inference may be performed in a deep learning algorithm using an artificial neural network. The deep learning algorithm may include a training step of learning a model through various data and an inference step of recognizing data with the learned model. For example, a function used for the inference may include a hyperbolic tangent function, a sigmoid function, and a rectified linear unit (ReLU) function.

As an example embodiment, an image obtained by a user through the camera 2100 may be signal-processed and may be stored in the DRAM 2500b, and the accelerator block 2820 or an accelerator chip may perform an AI data computation for recognizing data using data stored in the DRAM 2500b and a function used for inference.

According to an example embodiment, the mobile system 2000 may include a plurality of storages or a plurality of flash memory devices 2600a and 2600b having capacity larger than those of the DRAMs 2500a and 2500b. Each of the flash memory devices 2600a and 2600b may include the memory controller 2610 and the flash memory 2620. The memory controller 2610 may receive control commands and data from the AP 2800, may write data to the flash memory 2620 in response to a control command, or may read out data stored in the flash memory 2620 and may transmit the data to the AP 2800. In an example embodiment, each of the memory devices 2600a and 2600b may be the semiconductor device 1200 in FIG. 22. In this case, the memory controller 2610 may correspond to the peripheral circuit 1220 in FIG. 22 and the flash memory 2620 may correspond to the memory cell array 1210 in FIG. 22. In an example embodiment, the flash memory 2620 may correspond to the semiconductor device 1200 in FIG. 22.

According to an example embodiment, the accelerator block 2820 or the accelerator chip may perform a training step and AI data calculation using the flash memory devices 2600a and 2600b. In an example embodiment, an operation logic capable of executing a predetermined computation may be implemented in the memory controller 2610 in the flash memory devices 2600a and 2600b, and the operation logic may execute at least a portion of the training step and the inference AI data calculation performed by the AP 2800 and/or the accelerator block 2820 using the data stored in the flash memory 2620.

In an example embodiment, the AP 2800 may include an interface 2830, and accordingly, the flash memory devices 2600a and 2600b may be directly connected to the AP 2800. For example, the AP 2800 may be implemented as an SoC, the flash memory device 2600a may be implemented as a chip separated from the AP 2800, and the AP 2800 and the flash memory device 2600a may be mounted in a single package. However, an example embodiment thereof is not limited thereto, and the plurality of flash memory devices 2600a and 2600b may be electrically connected to the mobile system 2000 through a connection.

The flash memory device 2600a and 2600b may store data such as still images/videos obtained by the camera 2100, or data received through a communication network and/or ports included in the input and output devices 2700a and 2700b. For example, the flash memory device 2600a and 2600b may store augmented reality/virtual reality, high definition (HD) or ultra high definition (UHD) content.

At least one of the DRAMs 2500a and 2500b and the flash memory devices 2600a and 2600b may be implemented as memory devices in the example embodiments disclosed above. For example, at least one of the DRAMs 2500a and 2500b and the flash memory devices 2600a and 2600b may execute a verification operation according to example embodiments at every predetermined interval, and may execute a refresh operation and/or a repair operation if desired. Accordingly, operation performance and reliability of the mobile system 2000 may improve.

According to the aforementioned example embodiments, transfer circuits for transferring an internal clock to unit circuits of the semiconductor device may be included in a clock tree. Among the transfer circuits, a transfer circuit having the longest transfer path may adjust the internal clocks of the other transfer circuits with reference to the internal clock output to the unit circuit and may reduce a clock skew between the internal clocks input to the unit circuits. Also, by reducing the number of devices required to implement a clock tree, integration density of the semiconductor device may improve.

While an example embodiments have been shown and described above, it will be apparent to those skilled in the art that modifications and variations could be made without departing from the scope of the present disclosure as defined by the appended claims.

What is claimed is:

1. A semiconductor device, comprising:
   input/output circuits configured to input and output data signals according to a plurality of clock signals;
   a delay locked loop circuit configured to generate an internal clock signal;
   a plurality of repeaters connected between the delay locked loop circuit and the input/output circuits and configured to transmit the plurality of clock signals to the input/output circuits;
   a comparator having a first input terminal connected to a first input/output circuit and a second input terminal connected to a second input/output circuit among the input/output circuits, and configured to compare a first clock signal of the plurality of clock signals input to the first input/output circuit with a second clock signal of the plurality of clock signals input to the second input/output circuit; and
   a delay chain configured to adjust a phase of the second clock signal based on an output of the comparator, to allow the first clock signal and the second clock signal to have the same phase,
   wherein the plurality of clock signals are generated based on the clock signal.

2. The semiconductor device of claim 1, wherein the plurality of repeaters include a first repeater and a second repeater having an input terminal connected to an output terminal of the first repeater, and
   wherein the delay chain is connected between the first repeater and the second repeater.

3. The semiconductor device of claim 1, wherein the plurality of repeaters are configured to form a plurality of transfer circuits, and
   wherein the plurality of transfer circuits include a first transfer circuit which does not include the delay chain and a second transfer circuit including the delay chain.

4. The semiconductor device of claim 3, wherein the plurality of repeaters are connected to each other by an H-tree structure in each of the plurality of transfer circuits.

5. The semiconductor device of claim 3, wherein the second transfer circuit is connected between the first transfer circuit and the delay locked loop circuit.

6. The semiconductor device of claim 1, wherein the delay chain is configured to delay a phase of the second clock signal to allow the first clock signal and the second clock signal to have the same phase.

7. The semiconductor device of claim 1, wherein each of the plurality of repeaters includes a first transfer path and a second transfer path.

8. The semiconductor device of claim 7, wherein the number of repeaters connected to the first transfer path and the number of repeaters connected to the second transfer path are different from each other.

9. The semiconductor device of claim 7, wherein the number of repeaters connected to the first transfer path is greater than the number of repeaters connected to the second transfer path.

10. The semiconductor device of claim 1, further comprising:
    a counter configured to count outputs of the comparator.

11. A memory system comprising:
    at least one memory device having a plurality of memory chips; and
    a memory controller configured to control the at least one memory device,
    wherein the at least one memory device includes:
    input/output circuits configured to input and output data signals according to a plurality of clock signals;
    a delay locked loop circuit configured to generate an internal clock signal;
    a plurality of repeaters connected between the delay locked loop circuit and the input/output circuits and configured to transmit the plurality of clock signals to the input/output circuits;
    a comparator having a first input terminal connected to a first input/output circuit and a second input terminal connected to a second input/output circuit among the input/output circuits, and configured to compare a first clock signal of the plurality of clock signals input to the first input/output circuit with a second clock signal of the plurality of clock signals input to the second input/output circuit; and a delay chain configured to adjust a phase of the second clock signal based on an output of the comparator, to allow the first clock signal and the second clock signal to have the same phase, wherein the plurality of clock signals are generated based on the internal clock signal.

12. The memory system of claim 11, wherein the plurality of repeaters include a first repeater and a second repeater having an input terminal connected to an output terminal of the first repeater, and wherein the delay chain is connected between the first repeater and the second repeater.

13. The memory system of claim 11, wherein the plurality of repeaters are configured to form a plurality of transfer circuits, and wherein the plurality of transfer circuits include a first transfer circuit which does not include the delay chain and a second transfer circuit including the delay chain.

14. The memory system of claim 13, wherein the plurality of repeaters are connected to each other by an H-tree structure in each of the plurality of transfer circuits.

15. The memory system of claim 13, wherein the second transfer circuit is connected between the first transfer circuit and the delay locked loop circuit.

16. An operating method of a semiconductor memory device, the operating method comprising:

generating an internal clock signal from a delay locked loop circuit;

transmitting a plurality of clock signals from a plurality of repeaters to input/output circuits, the plurality of repeaters connected between the delay locked loop circuit and the input/output circuits;

comparing a first clock signal of the plurality of clock signals input to a first input/output circuit with a second clock signal of the plurality of clock signals input to a second input/output circuit among the input/output circuits by a comparator having a first input terminal connected to the first input/output circuit and a second input terminal connected to the second input/output circuit; and adjusting, by a delay chain, a phase of the second clock signal based on an output of the comparator to allow the first clock signal and the second clock signal to have the same phase, wherein the transmitting of the plurality or clock signals includes generating, by the plurality of repeaters, the plurality of clock signals based on the internal clock signal.

17. The operating method of claim 16, wherein the plurality of repeaters include a first repeater and a second repeater having an input terminal connected to an output terminal of the first repeater, and wherein the delay chain is connected between the first repeater and the second repeater.

18. The operating method of claim 16, wherein the plurality of repeaters are configured to form a plurality of transfer circuits, and wherein the plurality of transfer circuits include a first transfer circuit which does not include the delay chain and a second transfer circuit including the delay chain.

19. The operating method of claim 18, wherein the plurality of repeaters are connected to each other by an H-tree structure in each of the plurality of transfer circuits.

20. The operating method of claim 18, wherein the second transfer circuit is connected between the first transfer circuit and the delay locked loop circuit.

* * * * *